US012666672B2

(12) United States Patent
Kubouchi

(10) Patent No.: US 12,666,672 B2
(45) Date of Patent: Jun. 23, 2026

(54) SEMICONDUCTOR APPARATUS AND MANUFACTURING METHOD OF SEMICONDUCTOR APPARATUS HAVING A HYDROGEN INCREASING PORTION

(71) Applicant: FUJI ELECTRIC CO., LTD., Kawasaki (JP)

(72) Inventor: Motoyoshi Kubouchi, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 655 days.

(21) Appl. No.: 17/456,381

(22) Filed: Nov. 24, 2021

(65) Prior Publication Data

US 2022/0085166 A1     Mar. 17, 2022

Related U.S. Application Data

(63) Continuation of application No. PCT/JP2020/046623, filed on Dec. 14, 2020.

(30) Foreign Application Priority Data

Dec. 18, 2019     (JP) ................................. 2019-228298

(51) Int. Cl.
| | |
|---|---|
| *H10D 62/17* | (2025.01) |
| *H10D 12/00* | (2025.01) |
| *H10P 30/20* | (2026.01) |

(52) U.S. Cl.
CPC ......... *H10D 62/177* (2025.01); *H10D 12/481* (2025.01); *H10P 30/20* (2026.01)

(58) Field of Classification Search
CPC ............. H01L 29/1004; H01L 29/7397; H01L 29/407; H01L 29/0696; H01L 29/083;
(Continued)

(56) References Cited

U.S. PATENT DOCUMENTS

| | | | | |
|---|---|---|---|---|
| 10,026,803 | B1 * | 7/2018 | Nakamura | ........ H01L 21/26513 |
| 2006/0220044 | A1 * | 10/2006 | Sugawara | ........ H01L 21/02458 |
| | | | | 257/E29.093 |

(Continued)

FOREIGN PATENT DOCUMENTS

| | | |
|---|---|---|
| CN | 109075213 A | 12/2018 |
| CN | 113632236 A | 11/2021 |

(Continued)

OTHER PUBLICATIONS

"Monotonic increasing function" (definition) The Penguin Dictionary of Mathematics, Penguin Books, Ltd, 2008. Accessed in Credo Reference https://search.credoreference.com/articles/Qm9va0FydGljbGU6OTE4NzEy?q=monotonically+increases&aid=279753 (Year: 2008).*

(Continued)

*Primary Examiner* — William B Partridge
*Assistant Examiner* — Linda J. Fleck

(57)     ABSTRACT

Provided is a semiconductor apparatus including: a semiconductor substrate having an upper surface and a lower surface and containing a bulk donor; and a hydrogen increasing portion in which a hydrogen chemical concentration monotonically increases from the upper surface toward the lower surface. The hydrogen increasing portion is provided over 30% or more of a thickness of the semiconductor substrate in a depth direction. A donor concentration in the hydrogen increasing portion is higher than a bulk donor concentration. The semiconductor apparatus can be manufactured by implanting hydrogen ions from the upper surface of the semiconductor substrate to a predetermined first implantation position inside the semiconductor substrate, grinding the lower surface of the semiconductor substrate to remove a part of a region where hydrogen exists, (Continued)

A-A

DEPTH POSITION FROM UPPER SURFACE ($\mu$m)

and performing heat treatment on the semiconductor substrate.

15 Claims, 30 Drawing Sheets

(58) Field of Classification Search
CPC .............. H01L 29/36; H01L 29/66348; H01L 29/66477; H01L 29/78; H01L 29/861; H01L 29/868; H01L 29/6609; H01L 29/66568; H01L 21/265; H01L 21/26506; H01L 21/8234; H01L 21/26513; H01L 21/26546; H01L 21/823418; H01L 27/06; H01L 27/0652; H01L 27/088; H10D 62/177; H10D 12/481; H10D 12/038; H10D 8/50; H10D 64/117; H10D 30/021; H10D 30/60; H10D 30/027; H10D 62/127; H10D 62/141; H10D 62/60; H10D 84/00; H10D 84/0126; H10D 84/038; H10D 84/013; H10D 84/613; H10D 84/83; H10D 8/00; H10D 8/01; H10P 30/20; H10P 30/21; H10P 30/204; H10P 30/206; H10P 30/208
See application file for complete search history.

(56) References Cited

U.S. PATENT DOCUMENTS

| | | | |
|---|---|---|---|
| 2011/0027957 A1* | 2/2011 | Berry | H01L 21/228 257/E21.135 |
| 2013/0249058 A1 | 9/2013 | Neidhart | |
| 2014/0151858 A1* | 6/2014 | Schulze | H01L 21/324 438/530 |
| 2014/0246755 A1 | 9/2014 | Yoshimura | |
| 2014/0357026 A1* | 12/2014 | Kobayashi | H10D 12/032 438/530 |
| 2015/0050754 A1 | 2/2015 | Ploss | |
| 2015/0054035 A1* | 2/2015 | Heo | H01L 29/4966 257/194 |
| 2015/0270132 A1 | 9/2015 | Laven | |
| 2015/0311279 A1 | 10/2015 | Onozawa | |
| 2016/0141399 A1 | 5/2016 | Jelinek | |
| 2016/0211336 A1* | 7/2016 | Laven | H10D 62/40 |
| 2016/0372541 A1* | 12/2016 | Onozawa | H10D 62/106 |
| 2017/0271447 A1 | 9/2017 | Tamura | |
| 2018/0005831 A1 | 1/2018 | Schulze | |
| 2018/0122895 A1 | 5/2018 | Jelinek | |
| 2018/0350962 A1* | 12/2018 | Naito | H01L 21/324 |
| 2019/0067462 A1 | 2/2019 | Tamura | |
| 2020/0194562 A1* | 6/2020 | Yoshimura | H01L 21/22 |
| 2021/0028284 A1* | 1/2021 | Eriguchi | H01L 29/207 |
| 2021/0104407 A1* | 4/2021 | Meguro | H01L 21/266 |
| 2022/0013368 A1 | 1/2022 | Agata | |
| 2022/0013643 A1* | 1/2022 | Agata | H01L 29/36 |
| 2022/0084828 A1* | 3/2022 | Yoshida | H01L 29/7397 |
| 2023/0111002 A1* | 4/2023 | Tamaki | H01L 21/3003 257/617 |
| 2024/0266176 A1* | 8/2024 | Meguro | H10D 84/617 |

FOREIGN PATENT DOCUMENTS

| | | |
|---|---|---|
| JP | 2007266233 A | 10/2007 |
| WO | 2013100155 A1 | 7/2013 |
| WO | 2014208404 A1 | 12/2014 |
| WO | 2016204227 A1 | 12/2016 |
| WO | WO-2019181852 A1 * | 9/2019 ............. H01L 21/22 |

OTHER PUBLICATIONS

International Search Report and (ISA/237) Written Opinion of the International Search Authority for International Patent Application No. PCT/JP2020/046623, mailed by the Japan Patent Office on Mar. 9, 2021.

Office Action issued for counterpart Chinese Application 202080039220. 9, issued by The State Intellectual Property Office of People's Republic of China on Jul. 19, 2024.

Office Action issued for counterpart Chinese Application 202080039220. 9, issued by The State Intellectual Property Office of People's Republic of China on Nov. 28, 2024.

* cited by examiner

A—A

A–A

DEPTH POSITION FROM UPPER SURFACE (μm)

CONCENTRATION (/cm³)

100

F-F

DEPTH POSITION FROM UPPER SURFACE (μm)

F-F

DEPTH POSITION FROM UPPER SURFACE (μm)

G–G

HYDROGEN ION

Z1

21

H

10

Z2

23

Z3

19

Zi1

H

Z

Y

X

100

SEMICONDUCTOR APPARATUS AND MANUFACTURING METHOD OF SEMICONDUCTOR APPARATUS HAVING A HYDROGEN INCREASING PORTION

The contents of the following Japanese and PCT patent applications are incorporated herein by reference:
No. 2019-228298 filed in JP on Dec. 18, 2019 and
No. PCT/JP2020/046623 filed on Dec. 14, 2020.

BACKGROUND

1. Technical Field

The present invention relates to a semiconductor apparatus and a manufacturing method.

2. Related Art

Conventionally, there is known a technique in which hydrogen is implanted into a predetermined depth of a semiconductor substrate and diffused, so that lattice defects formed in the region where hydrogen have passed through are bonded to hydrogen to form a donor, and a doping concentration can be increased (see, for example, Patent Literatures 1 to 3).

Patent Literature 1: Specification of U.S. Patent Application Publication No. 2015/0050754
Patent Literature 2: Japanese republication of a PCT rout patent application No. 2016-204227
Patent Literature 3: Japanese Patent Application Publication No. 2007-266233

Problems to be Solved

When hydrogen is implanted into a predetermined depth of the semiconductor substrate, the donor concentration in the vicinity of the depth increases.

GENERAL DISCLOSURE

In order to solve the above problem, a first aspect of the present invention provides a semiconductor apparatus. The semiconductor apparatus may include a semiconductor substrate having an upper surface and a lower surface and containing a bulk donor. The semiconductor apparatus may include a hydrogen increasing portion in which the hydrogen chemical concentration monotonically increases from the upper surface toward the lower surface. The hydrogen increasing portion may be provided over 30% or more of the thickness of the semiconductor substrate in the depth direction. The donor concentration in the hydrogen increasing portion may be higher than the bulk donor concentration.

The hydrogen chemical concentration may monotonically increase from the upper surface to the lower surface except for a portion where a local hydrogen concentration peak is provided.

The hydrogen increasing portion may have a portion where the slope of the hydrogen chemical concentration distribution in the depth direction increases toward the lower surface on the lower surface side of the semiconductor substrate.

The semiconductor substrate may have a hydrogen concentration peak provided in a region other than the hydrogen increasing portion.

The semiconductor apparatus may include a drift region of the first conductivity type provided on the semiconductor substrate. The semiconductor apparatus may include a base region of the second conductivity type provided between the upper surface of the semiconductor substrate and the drift region. The semiconductor apparatus may include an emitter region of a first conductivity type provided between the upper surface of the semiconductor substrate and the base region and having a higher doping concentration than the drift region. The semiconductor apparatus may include a buffer region of a first conductivity type provided between the lower surface of the semiconductor substrate and the drift region and having a higher doping concentration than the drift region. The semiconductor apparatus may include a gate trench portion provided from the upper surface of the semiconductor substrate to a depth position reaching the drift region. The buffer region may include a hydrogen concentration peak. The hydrogen increasing portion may be disposed between the lower end of the trench portion and the upper end of the buffer region.

The hydrogen increasing portion may be provided from the lower end of the trench portion to the upper end of the buffer region.

The hydrogen chemical concentration distribution in the buffer region may have a lower tail from the hydrogen concentration peak toward the lower surface and an upper tail from the hydrogen concentration peak toward the upper surface. The hydrogen chemical concentration of the upper tail may change more steeply than the lower tail. The hydrogen chemical concentration may monotonically increase from the lower end to the upper tail of the trench portion.

The hydrogen increasing portion may include a lifetime adjustment portion that adjusts a lifetime of a carrier.

The semiconductor apparatus may include a drift region of the first conductivity type provided on the semiconductor substrate. The semiconductor apparatus may include an accumulation region of a first conductivity type provided between the upper surface of the semiconductor substrate and the drift region and having a higher doping concentration than the drift region. The semiconductor apparatus may include a base region of a second conductivity type provided between the upper surface of the semiconductor substrate and the accumulation region. The semiconductor apparatus may include an emitter region of a first conductivity type provided between the upper surface of the semiconductor substrate and the base region and having a higher doping concentration than the drift region. A gate trench portion may be provided from the upper surface of the semiconductor substrate to a depth position reaching the drift region. The accumulation region may include a hydrogen concentration peak. The hydrogen increasing portion may be disposed between the lower end of the trench portion and the lower surface of the semiconductor substrate.

A second aspect of the present invention provides a manufacturing method of a semiconductor apparatus including a semiconductor substrate having an upper surface and a lower surface. The manufacturing method may include firstly implanting hydrogen ions from the upper surface of the semiconductor substrate to a predetermined first implantation position inside the semiconductor substrate. The manufacturing method may include grinding the lower surface of the semiconductor substrate to remove a part of the region where hydrogen exists. The manufacturing method may include performing heat treatment on the semiconductor substrate. The first implantation position may be disposed on the lower surface side in the semiconductor substrate after the grinding. The grinding may be prior to the firstly implanting the hydrogen ions.

In the grinding, the region including the first implantation position may be removed. In a case where the grinding is performed before the firstly implanting the hydrogen ions, the first implantation position may be a position in a region where the semiconductor substrate is ground and removed. The manufacturing method may include secondly implanting hydrogen ions from the upper surface or the lower surface of the semiconductor substrate to a predetermined second implantation position inside the semiconductor substrate before the performing the heat treatment.

In the grinding, the region including the second implantation position may be removed.

Hydrogen may be implanted into the second implantation position so that the first hydrogen concentration peak of hydrogen implanted by the firstly implanting the hydrogen ions and the second hydrogen concentration peak of hydrogen implanted by the secondly implanting the hydrogen ions overlap each other.

The second implantation position may be disposed at a position not ground in the grinding.

Note that the above summary of the invention does not enumerate all the necessary features of the present invention. The present invention may also be a sub-combination of the features described above.

DESCRIPTION OF EXEMPLARY EMBODIMENTS

Figure 1:
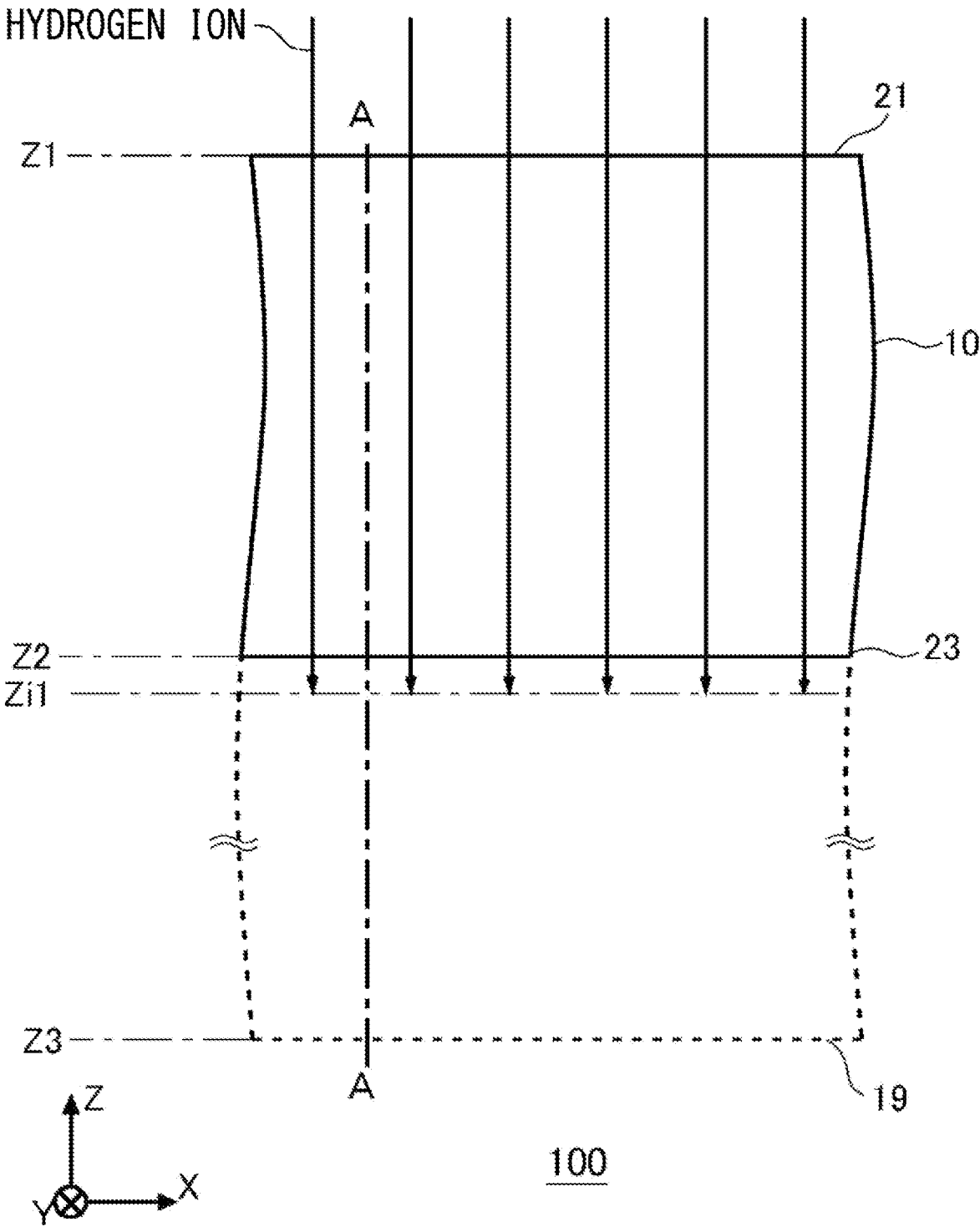
FIG. 1 is a sectional view illustrating an example of a semiconductor apparatus 100.

Hereinafter, the present invention will be described through embodiments of the invention, but the following embodiments do not limit the invention according to the claims. In addition, not all combinations of features described in the embodiments are essential to the solution of the invention.

In the present specification, one side in a direction parallel to the depth direction of the semiconductor substrate is referred to as "upper", and the other side is referred to as "lower". One of two main surfaces of a substrate, a layer, or another member is referred to as an upper surface, and the other surface is referred to as a lower surface. The "upper" and "lower" directions are not limited to the gravity direction or the direction at the time of mounting the semiconductor apparatus.

In the present specification, technical matters may be described using orthogonal coordinate axes of an X axis, a Y axis, and a Z axis. The orthogonal coordinate axes merely identify relative positions of the components, and do not limit a specific direction. For example, the Z axis does not limit the height direction with respect to the ground. The +Z axis direction and the −Z axis direction are opposite to each other. In a case where the positive and negative are not described and described as the Z axis direction, it means a direction parallel to the +Z axis and the −Z axis.

In the present specification, orthogonal axes parallel to the upper surface and the lower surface of the semiconductor substrate are defined as an X axis and a Y axis. An axis perpendicular to the upper surface and the lower surface of the semiconductor substrate is defined as a Z axis. In the present specification, the Z axis direction may be referred to as a depth direction. In addition, in the present specification, a direction parallel to the upper surface and the lower surface of the semiconductor substrate including the X axis and the Y axis may be referred to as a horizontal direction.

In addition, a region from the center of the semiconductor substrate in the depth direction to the upper surface of the semiconductor substrate may be referred to as an upper surface side. Similarly, a region from the center of the semiconductor substrate in the depth direction to the lower surface of the semiconductor substrate may be referred to as a lower surface side.

In the present specification, the term "same" or "equal" may include a case where there is an error due to manufacturing variation or the like. The error is, for example, within 10%.

In the present specification, the conductivity type of the doping region doped with impurities is described as a P type or N type. In the present specification, the impurity may particularly mean either an N type donor or a P type acceptor, and may be described as a dopant. In the present specification, doping means introducing a donor or an acceptor into a semiconductor substrate to form a semiconductor exhibiting an N type conductivity type or a semiconductor exhibiting a P type conductivity type.

In the present specification, the doping concentration means the concentration of donors or the concentration of the acceptors in the thermal equilibrium state. In the present specification, the net doping concentration means the net concentration obtained by adding the donor concentration as the concentration of positive ions and the acceptor concentration as the concentration of negative ions including the polarity of charges. As an example, if the donor concentration is $N_D$ and the acceptor concentration is $N_A$, the net doping concentration at an arbitrary position is $N_D$–$N_A$. In the present specification, the net doping concentration may be simply referred to as a doping concentration.

The donor has a function of supplying electrons to the semiconductor. The acceptor has a function of receiving electrons from the semiconductor. The donor and acceptor are not limited to the impurities themselves. For example, a VOH defect in which vacancies (V), oxygen (O), and hydrogen (H) are bonded in a semiconductor functions as a donor for supplying electrons. In the present specification, the VOH defect may be referred to herein as a hydrogen donor.

In the present specification, when described as a P+ type or N+ type, it means that the doping concentration is higher than that of a P type or N type, and when described as a P− type or N− type, it means that the doping concentration is lower than that of the P type or N type. In addition, in the present specification, the description of the P++ type or N++ type means that the doping concentration is higher than that of the P+ type or N+ type. The unit system in the present specification is an SI unit system unless otherwise specified. The unit of length may be expressed in cm, but various calculations may be performed after conversion into meters (m).

In the present specification, the chemical concentration refers to the atomic density of impurities measured regardless of the state of electrical activation. The chemical concentration can be measured by, for example, secondary ion mass spectrometry (SIMS). The above-described net doping concentration can be measured by a voltage-capacitance measurement method (CV method). In addition, the carrier concentration measured by a spread resistance measurement method (SR method) may be a net doping concentration. The carrier concentration measured by the CV method or the SR method may be a value in a thermal equilibrium state. In addition, since the donor concentration is sufficiently larger than the acceptor concentration in the N type region, the carrier concentration in the region may be used as the donor concentration. Similarly, in the P type region, the carrier concentration in the region may be set as the acceptor concentration. In the present specification, the doping concentration of the N type region may be referred to as a donor concentration, and the doping concentration of the P type region may be referred to as an acceptor concentration.

In addition, in a case where the concentration distribution of the donor, acceptor, or net doping has a peak, the peak value may be the concentration of donors, acceptors, or net doping in the region. In a case where the concentration of the donor, the acceptor, or the net doping is approximately uniform or the like, an average value of the concentration of the donor, the acceptor, or the net doping in the corresponding region may be used as the concentration of the donor, the acceptor, or the net doping. In the present specification, atoms/cm³ or /cm³ is used for concentration display per unit volume. This unit is used for the donor or acceptor concentration or the chemical concentration in the semiconductor substrate. The expression of atoms may be omitted.

The carrier concentration measured by the SR method may be lower than the concentration of donors or acceptors. In a range where the current flows when measuring a spreading resistance, there is a case where the carrier mobility of the semiconductor substrate is lower than the value of the crystal state. The decrease in carrier mobility occurs by disorder of the crystal structure caused by a lattice defect or the like to make the carrier scatter.

The concentration of donors or acceptors calculated from the carrier concentration measured by the CV method or the SR method may be lower than the chemical concentration of elements indicating the donor or the acceptor. As an example, the donor concentration of phosphorus or arsenic as a donor, or the acceptor concentration of boron as an acceptor in a silicon semiconductor is about 99% of its chemical concentration. On the other hand, the donor concentration of hydrogen as a donor in the silicon semiconductor is about 0.1% to 10% of the chemical concentration of hydrogen. Each concentration in the present specification may be a value at room temperature. As the value at room temperature, a value at 300 K (Kelvin) (about 26.9° C.) may be used as an example.

FIG. 1 is a sectional view illustrating an example of a semiconductor apparatus 100. The semiconductor apparatus 100 includes a semiconductor substrate 10. The semiconductor substrate 10 is a substrate formed of a semiconductor material. As an example, the semiconductor substrate 10 is a silicon substrate.

At least one of a transistor device such as an insulated gate bipolar transistor (IGBT) and a diode device such as a freewheeling diode (FWD) is formed on the semiconductor substrate 10. In FIG. 1, the respective electrodes of the transistor device and the diode device, and the respective regions provided in the semiconductor substrate 10 are omitted. Configuration examples of the transistor device and the diode device will be described later.

In the semiconductor substrate 10 of the present example, bulk donors of an N type are distributed throughout. The bulk donor is a dopant donor approximately uniformly contained in an ingot during the production of the ingot from which the semiconductor substrate 10 is based. The bulk donor of the present example is an element other than hydrogen. The dopant of the bulk donor is, for example, phosphorus, antimony, arsenic, selenium, or sulfur, but the invention is not limited to these. The bulk donor of the present example is phosphorus. The bulk donor is also contained in a P type region.

The semiconductor substrate 10 may be a wafer cut out from a semiconductor ingot, or may be a chip obtained by dicing the wafer into individual pieces. The semiconductor ingot may be manufactured by either a Chokralski method (CZ method), a magnetic field applied Chokralski method (MCZ method), or a float zone method (FZ method). The ingot in the present example is manufactured by the MCZ method. The substrate manufactured by the MCZ method has an oxygen concentration of $1 \times 10^{17}$ to $7 \times 10^{17}/\mathrm{cm}^3$. The oxygen concentration contained in the substrate manufactured by the FZ method is $1 \times 10^{15}$ to $5 \times 10^{16}/\mathrm{cm}^3$. When the oxygen concentration is high, hydrogen donors tend to be easily generated. As the bulk donor concentration, the chemical concentration of the bulk donor distributed throughout the semiconductor substrate 10 may be used, or a value between 90% and 100% of the chemical concentration may be used. As the semiconductor substrate 10, a non-doped substrate not containing a dopant such as phosphorus may be used. In that case, the bulk donor concentration (D0) of the non-doped substrate is, for example, from $1 \times 10^{10}/\mathrm{cm}^3$ to $5 \times 10^{12}/\mathrm{cm}^3$. The bulk donor concentration (D0) of the non-doped substrate is preferably $1 \times 10^{11}/\mathrm{cm}^3$ or more. The bulk donor concentration (D0) of the non-doped substrate is preferably $5 \times 10^{12}/\mathrm{cm}^3$ or less.

The semiconductor substrate 10 is adjusted to have a thickness corresponding to a predetermined breakdown voltage by grinding the lower surface. FIG. 1 illustrates a lower surface 19 before grinding and a lower surface 23 after grinding. In addition, a region of the semiconductor substrate 10 removed by grinding is indicated by a broken line. In the present specification, the semiconductor substrate 10 will be described as a substrate after grinding unless otherwise described.

The semiconductor substrate 10 after grinding has an upper surface 21 and the lower surface 23 facing each other. The upper surface 21 and the lower surface 23 are two main surfaces of the semiconductor substrate 10. In the present specification, an orthogonal axis in a plane parallel to the upper surface 21 and the lower surface 23 is defined as an X axis and a Y axis, and an axis perpendicular to the upper surface 21 and the lower surface 23 is defined as a Z axis.

In the semiconductor substrate 10 before grinding, hydrogen ions (for example, protons) are implanted at a first implantation position Zi1 from the upper surface 21. The first implantation position Zi1 is a position where the distance from the upper surface 21 in the depth direction (Z axis direction) is Zi1. In the present specification, unless otherwise defined, the position in the Z axis direction is defined by a distance from the upper surface 21. The average distance (also referred to as a range) over which hydrogen ions pass through the inside of the semiconductor substrate 10 can be controlled by acceleration energy for accelerating hydrogen ions. In the present example, the acceleration energy is adjusted so that the range of hydrogen ions becomes the distance Zi1.

The hydrogen chemical concentration shows a peak at the first implantation position Zi1. In addition, some hydrogen ions remain in a region through which hydrogen ions have passed in the semiconductor substrate 10. Therefore, hydrogen can be distributed from the upper surface 21 to the first implantation position Zi1. In the present specification, a region through which the implanted hydrogen ions have passed may be referred to as a pass-through region. In the example of FIG. 1, a region from the upper surface 21 of the semiconductor substrate 10 to the first implantation position Zi1 is the pass-through region. Hydrogen ions may be implanted into the entire upper surface 21, or hydrogen ions may be implanted into only a partial region.

In the pass-through region through which the hydrogen ions have passed in the semiconductor substrate 10, lattice defects mainly including vacancies such as monovacancies (V) and divacancies (VV) are formed by the passage of hydrogen. Atoms adjacent to the vacancies have dangling bonds. Lattice defects include interstitial atoms, dislocations, and the like, and may include donors and acceptors in a broad sense. However, in the present specification, lattice defects mainly including vacancies may be referred to as vacant-type lattice defects, vacant-type defects, or simply lattice defects. In addition, since a large number of lattice defects are formed due to the implantation of hydrogen ions into the semiconductor substrate 10, the crystallinity of the semiconductor substrate 10 may be strongly disturbed. In the present specification, this disturbance of crystallinity may be referred to as disorder.

In addition, oxygen is contained in the entire semiconductor substrate 10. The oxygen is introduced intentionally or unintentionally at the time of manufacturing a semiconductor ingot. In the semiconductor substrate 10, a hydrogen (H), a vacancy (V), and an oxygen (O) are bonded to form a VOH defect. In addition, the heat treatment of the semiconductor substrate 10 makes hydrogen diffuse to promote the formation of VOH defects. The VOH defect serves as a donor that supplies electrons. In the present specification, VOH defects may be referred to simply as hydrogen donors. In the semiconductor substrate 10 of the present example, hydrogen donors are formed in the pass-through region of hydrogen ions. The doping concentration of the hydrogen donor is lower than the chemical concentration of hydrogen. When the ratio of the doping concentration of the hydrogen donor to the chemical concentration of hydrogen is defined as an activation rate, the activation rate may be a value of 0.1% to 30%. In the present example, the activation rate is 1% to 5%.

By forming a hydrogen donor in the pass-through region of the semiconductor substrate 10, the donor concentration in the pass-through region can be made higher than the bulk donor concentration. Usually, it is necessary to prepare the semiconductor substrate 10 having a predetermined bulk donor concentration in accordance with characteristics of an element to be formed on the semiconductor substrate 10, particularly a rated voltage or a breakdown voltage. On the other hand, according to the semiconductor apparatus 100 illustrated in FIG. 1, the donor concentration of the semiconductor substrate 10 can be adjusted by controlling the dose amount of hydrogen ions. Therefore, the semiconductor apparatus 100 can be manufactured using a semiconductor substrate having a bulk donor concentration that does not correspond to the characteristics and the like of the element. The variation in the bulk donor concentration at the time of manufacturing the semiconductor substrate 10 is relatively large, but the dose amount of hydrogen ions can be controlled with relatively high accuracy. Therefore, the concentration of lattice defects generated by implanting hydrogen ions can also be controlled with high accuracy, and the donor concentration of the pass-through region can be controlled with high accuracy.

In addition, in the process of grinding the lower surface 19, a part of the region where hydrogen exists is removed. The lower surface 19 may be ground to the vicinity of the first implantation position Zi1. In the example of FIG. 1, the lower surface 19 of the semiconductor substrate 10 is ground to the upper surface 21 side from the first implantation position Zi1. In the vicinity of the first implantation position Zi1, a relatively large number of hydrogen donors are formed. By grinding to the vicinity of the first implantation position Zi1, at least a part of the high concentration region in the vicinity of the concentration peak of the hydrogen donor can be removed. This makes it easy to remove an unnecessary high concentration region and adjust the characteristics of the semiconductor apparatus 100. In addition, a relatively large number of lattice defects are formed in the vicinity of the first implantation position Zi1. By grinding to the vicinity of the first implantation position Zi1, at least a part of the region having a larger number of lattice defects is removed, and the characteristics of the semiconductor apparatus 100 can be easily adjusted.

The lower surface 23 after grinding may be disposed closer to the upper surface 21 than the first implantation position Zi1, may be disposed closer to the lower surface 19, or may be disposed at the first implantation position Zi1. The distance between the lower surface 23 and the first implantation position Zi1 in the Z axis direction may be 10 μm or less, 5 μm or less, or 1 μm or less. In the present specification, the depth position of the upper surface 21 is Z1 (that is, the distance between the upper surface 21 and the depth position Z1 is 0 μm), the depth position of the lower surface 23 is Z2, and the depth position of the lower surface 19 is Z3.

Figure 2:
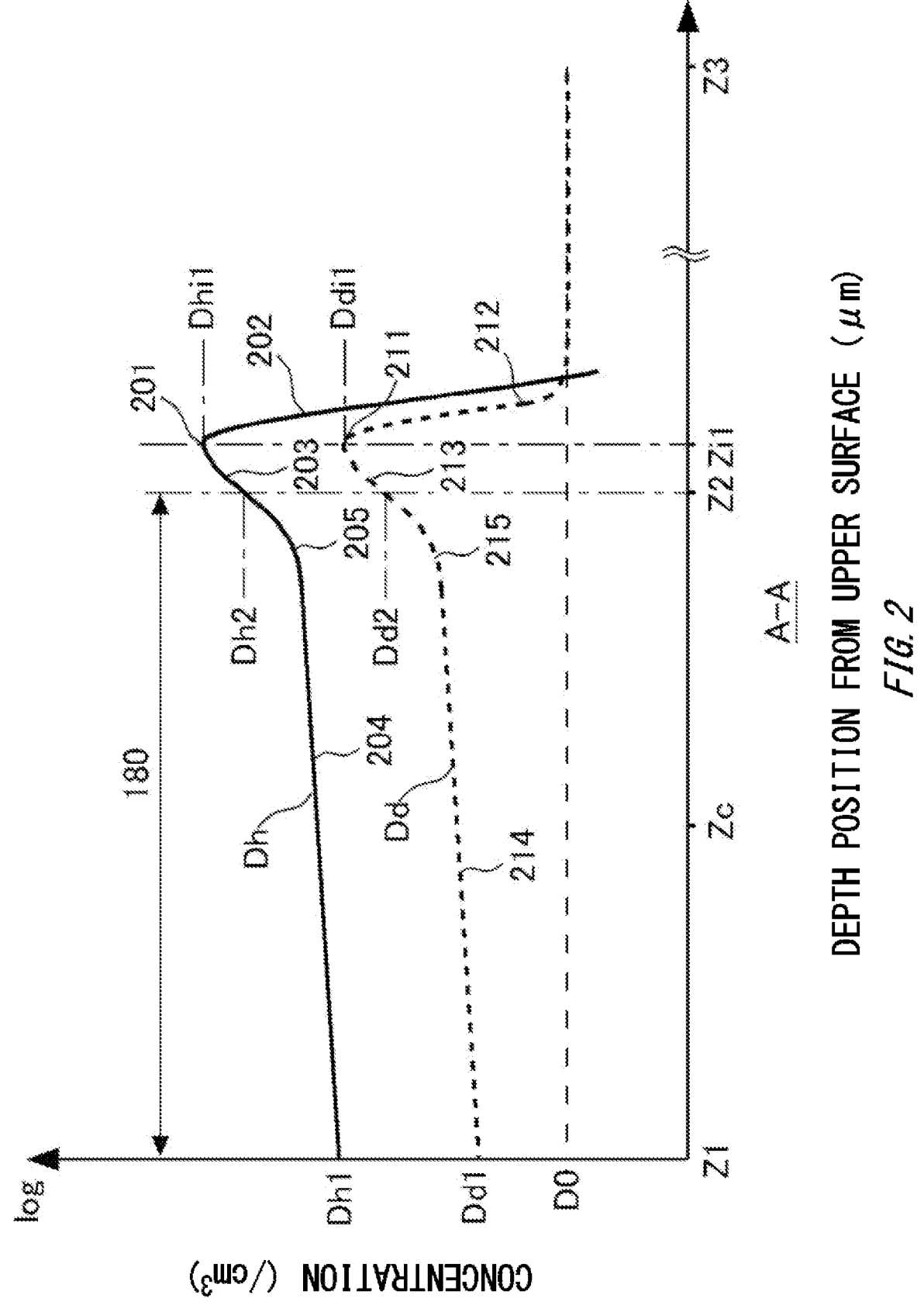
FIG. 2 illustrates an example of a distribution of a hydrogen chemical concentration Dh, a distribution of a donor concentration Dd, and a distribution of a bulk donor concentration D0 in a depth direction at a position indicated by line A-A in FIG. 1.

FIG. 2 illustrates an example of the distribution of the hydrogen chemical concentration Dh, the distribution of the donor concentration Dd, and the distribution of the bulk donor concentration D0 in the depth direction at the position indicated by line A-A in FIG. 1. In FIG. 2, the horizontal axis is a linear axis indicating a depth position from the upper surface 21, and the vertical axis is a logarithmic axis indicating concentration per unit volume. The donor concentration Dd in FIG. 2 is measured by, for example, the CV method or the SR method. The hydrogen chemical concentration Dh in FIG. 2 is, for example, a hydrogen concentration measured by a SIMS method. The bulk donor concentration D0 is, for example, a phosphorus concentration measured by the SIMS method. However, the phosphorus concentration locally implanted into the semiconductor substrate 10 is excluded. The bulk donor concentration D0 is uniform over the entire surface of the semiconductor substrate 10. In FIG. 2, the hydrogen chemical concentration Dh is indicated by a solid line, and the donor concentration Dd and the bulk donor concentration D0 are indicated by a broken line.

In FIG. 2, the center position of the semiconductor substrate 10 in the depth direction is defined as Zc. In addition, the hydrogen chemical concentration in the upper surface 21 of the semiconductor substrate 10 is denoted by Dh1, the donor concentration is denoted by Dd1, the hydrogen chemical concentration in the lower surface 23 is denoted by Dh2, the donor concentration is denoted by Dd2, the hydrogen chemical concentration in the first implantation position Zi1 is denoted by Dhi1, and the donor concentration is denoted by Ddi1.

At the first implantation position Zi1, the hydrogen chemical concentration Dh has a first hydrogen concentration peak 201, and the donor concentration Dd has a first donor concentration peak 211. The distribution of the hydrogen chemical concentration Dh has a lower tail 202 extending from the first hydrogen concentration peak 201 toward the lower surface 23 and an upper tail 203 extending from the first hydrogen concentration peak 201 toward the upper surface 21. Since hydrogen ions are implanted from the upper surface 21 to the first implantation position Zi1, the hydrogen chemical concentration steeply decreases in a region closer to the lower surface 23 than the first implantation position Zi1. Therefore, the lower tail 202 has a steeper change in hydrogen chemical concentration than the upper tail 203. The distribution of the donor concentration Dd has a lower tail 212 extending from the first donor concentration peak 211 toward the lower surface 23 and an upper tail 213 extending from the first donor concentration peak 211 toward the upper surface 21. The lower tail 212 has a steeper change in donor concentration than the upper tail 213.

The semiconductor substrate 10 includes a hydrogen increasing portion 180 in which the hydrogen chemical concentration Dh monotonically increases from the upper surface 21 toward the lower surface 23. The monotonically increasing means that there is no portion where the hydrogen chemical concentration Dh decreases from the upper surface 21 toward the lower surface 23. That is, the hydrogen increasing portion 180 is configured by a region where the hydrogen chemical concentration Dh does not change and a region where the hydrogen chemical concentration Dh increases from the upper surface 21 toward the lower surface 23. Since hydrogen ions are implanted into the first implantation position Zi1 from the upper surface 21, the hydrogen chemical concentration Dh tends to be higher as it is closer to the first implantation position Zi1, and the hydrogen chemical concentration Dh tends to be lower as it is closer to the upper surface 21. In addition, since the high concentration of hydrogen in the vicinity of the first implantation position Zi1 is diffused toward the upper surface 21 by performing the heat treatment on the semiconductor substrate 10, the hydrogen chemical concentration Dh tends to be higher as it is closer to the first implantation position Zi1. Therefore, the hydrogen increasing portion 180 is formed in the semiconductor substrate 10.

The hydrogen increasing portion 180 is continuously provided over 30% or more of the thickness Z2 in the depth direction of the semiconductor substrate 10. Thus, the donor concentration in the region of the semiconductor substrate 10 can be adjusted. The hydrogen increasing portion 180 may be continuously provided over 50% or more of the thickness Z2 of the semiconductor substrate 10, may be continuously provided over 70% or more, or may be continuously provided over 80% or more.

The hydrogen increasing portion 180 may be provided across the center position Zc of the semiconductor substrate 10. That is, hydrogen increasing portion 180 may be provided from the upper surface 21 side to the lower surface 23 side of the semiconductor substrate 10. The first implantation position Zi1 is disposed on the lower surface 23 side of the semiconductor substrate 10. In the example of FIG. 2, the lower surface 23 is disposed closer to the upper surface 21 than the first implantation position Zi1. In this case, the hydrogen increasing portion 180 may be provided from the upper surface 21 to the lower surface 23. In a case where the lower surface 23 is disposed closer to the lower surface 19 than the first implantation position Zi1, the first hydrogen concentration peak 201 is disposed inside the semiconductor substrate 10. In this case, the hydrogen increasing portion 180 is provided from the upper surface 21 to the first implantation position Zi1.

The distribution of the hydrogen chemical concentration Dh in the present example has a linear portion 204. The linear portion 204 is a region where the distribution shape of the hydrogen chemical concentration Dh is approximated by a straight line. In the linear portion 204, the hydrogen chemical concentration Dh monotonically increases toward the lower surface 23 or is substantially uniform. In a case where the upper tail 203 remains inside the semiconductor substrate 10, the distribution of the hydrogen chemical concentration Dh has a connection portion 205 connecting the linear portion 204 and the upper tail 203. The slope of the distribution of the hydrogen chemical concentration Dh increases toward the lower surface 23 in the connection portion 205. By leaving the upper tail 203 in the semiconductor substrate 10, a region having a relatively high hydrogen chemical concentration Dh can be left, so that hydrogen can be diffused from the region toward the upper surface 21. Therefore, a hydrogen donor is easily formed. In addition, since a region having a high donor concentration Dd remains, it can be used as a high-concentration N type region. The hydrogen chemical concentration Dh2 in the lower surface 23 may be 2 times or more, 5 times or more, or 10 times or more the hydrogen chemical concentration Dh1 in the upper surface 21.

The distribution of the donor concentration Dd has a linear portion 214. The linear portion 214 is a region where the distribution shape of the donor concentration Dd is approximated by a straight line. In a case where the upper tail 213 remains inside the semiconductor substrate 10, the distribution of the donor concentration Dd has a connection portion 215 connecting the linear portion 214 and the upper tail 213. The slope of the distribution of the donor concentration Dd may increase toward the lower surface 23 in the connection portion 215. The donor concentration Dd2 in the lower surface 23 may be 2 times or more, 5 times or more, or 10 times or more the donor concentration Dd1 in the upper surface 21.

Figure 3:
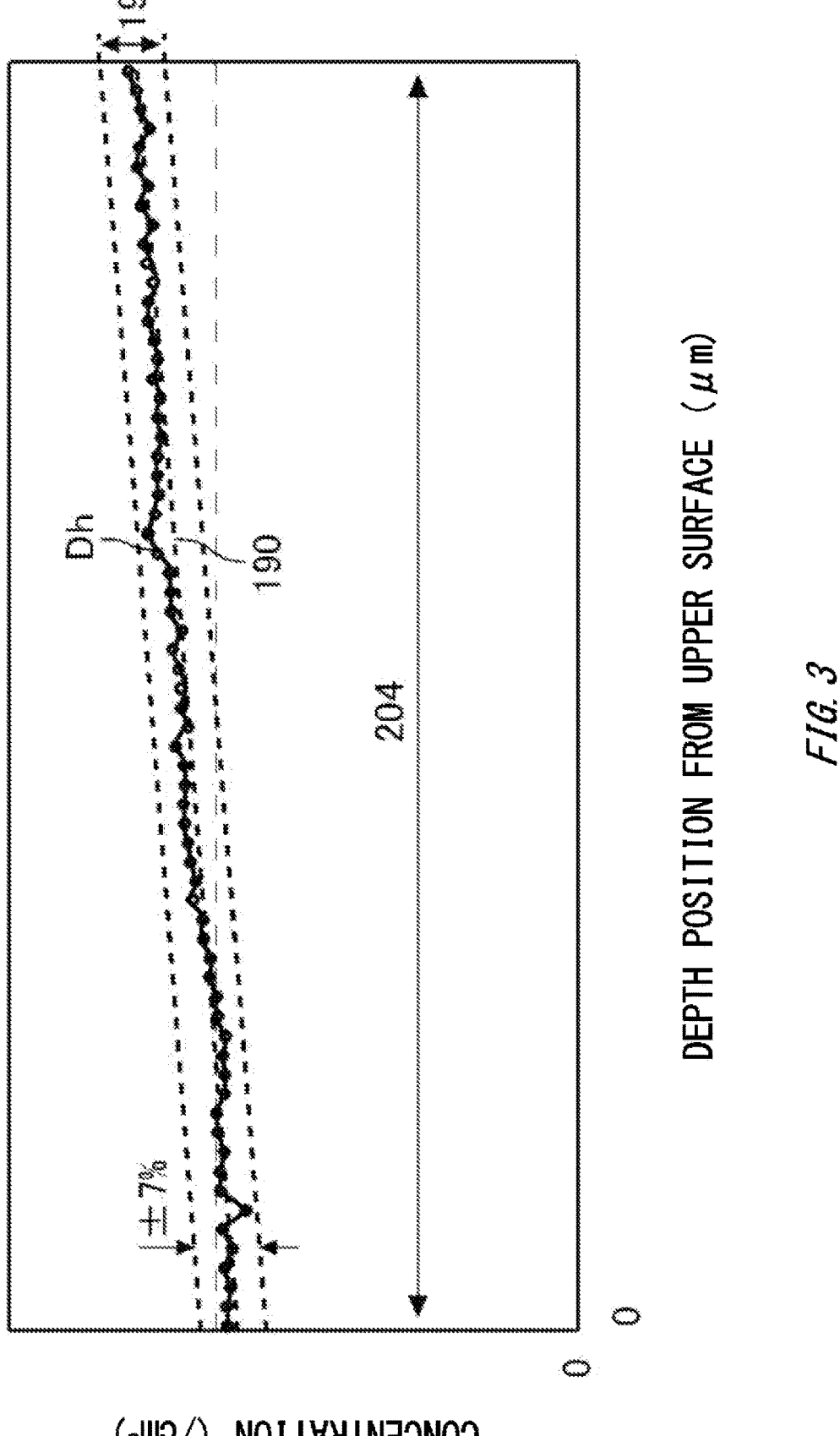
FIG. 3 is a diagram for explaining a distribution example of the hydrogen chemical concentration Dh in a linear portion 204.

FIG. 3 is a diagram for explaining a distribution example of the hydrogen chemical concentration Dh in linear portion 204. The vertical axis and the horizontal axis in the drawing are linear scales. The hydrogen chemical concentration Dh in the linear portion 204 is uniform or monotonically increases toward the lower surface 23. However, the distribution of the hydrogen chemical concentration Dh may have minute irregularities due to a measurement error or the like.

As described above, the distribution of the hydrogen chemical concentration Dh in the linear portion 204 is approximated by a straight line 190. The straight line 190 is flat or a straight line in which the hydrogen chemical concentration Dh increases from the upper surface 21 toward the lower surface 23. The hydrogen chemical concentration Dh in the linear portion 204 may have a variation of $\pm 7\%$ or less with respect to the straight line 190. A range having a width of $\pm 7\%$ with respect to the straight line 190 is defined as a band-shaped range 192. The width of the band-shaped range 192 may be $\pm 17\%$ of the value of the straight line 190 or $\pm 30\%$ of the value of the straight line 190.

A region where the hydrogen chemical concentration Dh falls within the band-shaped range 192 may be defined as the linear portion 204. The linear portion 204 may be continuously provided over a length of 30% or more of the thickness of the semiconductor substrate 10, may be continuously provided over a length of 50% or more, or may be continuously provided over a length of 70% or more.

A distribution obtained by connecting the hydrogen chemical concentrations Dh at both ends in the depth direction of the linear portion 204 by a straight line may be defined as the straight line 190. The straight line 190 may be a straight line obtained by fitting the hydrogen chemical concentration Dh in a predetermined region with a linear function.

The absolute value of the slope of the straight line 190 in the linear portion 204 may be $0/(\text{cm}^3 \cdot \mu\text{m})$ or more and $2 \times 10^{12}/(\text{cm}^3 \cdot \mu\text{m})$ or less, or may be more than $0/(\text{cm}^3 \cdot \mu\text{m})$ and $1 \times 10^{12}/(\text{cm}^3 \cdot \mu\text{m})$ or less with respect to the depth ($\mu$m). Further, the absolute value of the slope of the straight line 190 in the linear portion 204 may be $1 \times 10^{10}/(\text{cm}^3 \cdot \mu\text{m})$ or more and $1 \times 10^{12}/(\text{cm}^3 \cdot \mu\text{m})$ or less, and may be $1 \times 10^{10}/(\text{cm}^3 \cdot \mu\text{m})$ or more and $5 \times 10^{11}/(\text{cm}^3 \cdot \mu\text{m})$ or less with respect to the depth ($\mu$m). Here, $5 \times 10^{11}/(\text{cm}^3 \cdot \mu\text{m})$ is the same slope (equivalent) as $5 \times 10^{15}/\text{cm}^4$.

A semi-logarithmic slope may be used as another index of the slope of the straight line 190. The position of one end in the depth direction of the linear portion 204 is defined as x1 (cm), and the position of the other end is defined as x2 (cm). The concentration at x1 is denoted by N1 ($/\text{cm}^3$), and the concentration at x2 is denoted by N2 ($/\text{cm}^3$). A semi-logarithmic slope $\eta$ ($/\text{cm}$) in a predetermined region is defined as $\eta = (\log_{10}(\text{N2}) - \log_{10}(\text{N1}))/(\text{x2} - \text{x1})$. The absolute value of the semi-logarithmic slope $\eta$ of the straight line 190 in the linear portion 204 may range from 0/cm to 50/cm, or may range from 0/cm to 30/cm. Further, the absolute value of the semi-logarithmic slope $\eta$ of the straight line 190 in the linear portion 204 may range from 0/cm to 20/cm, or may range from 0/cm to 10/cm.

Figure 4:
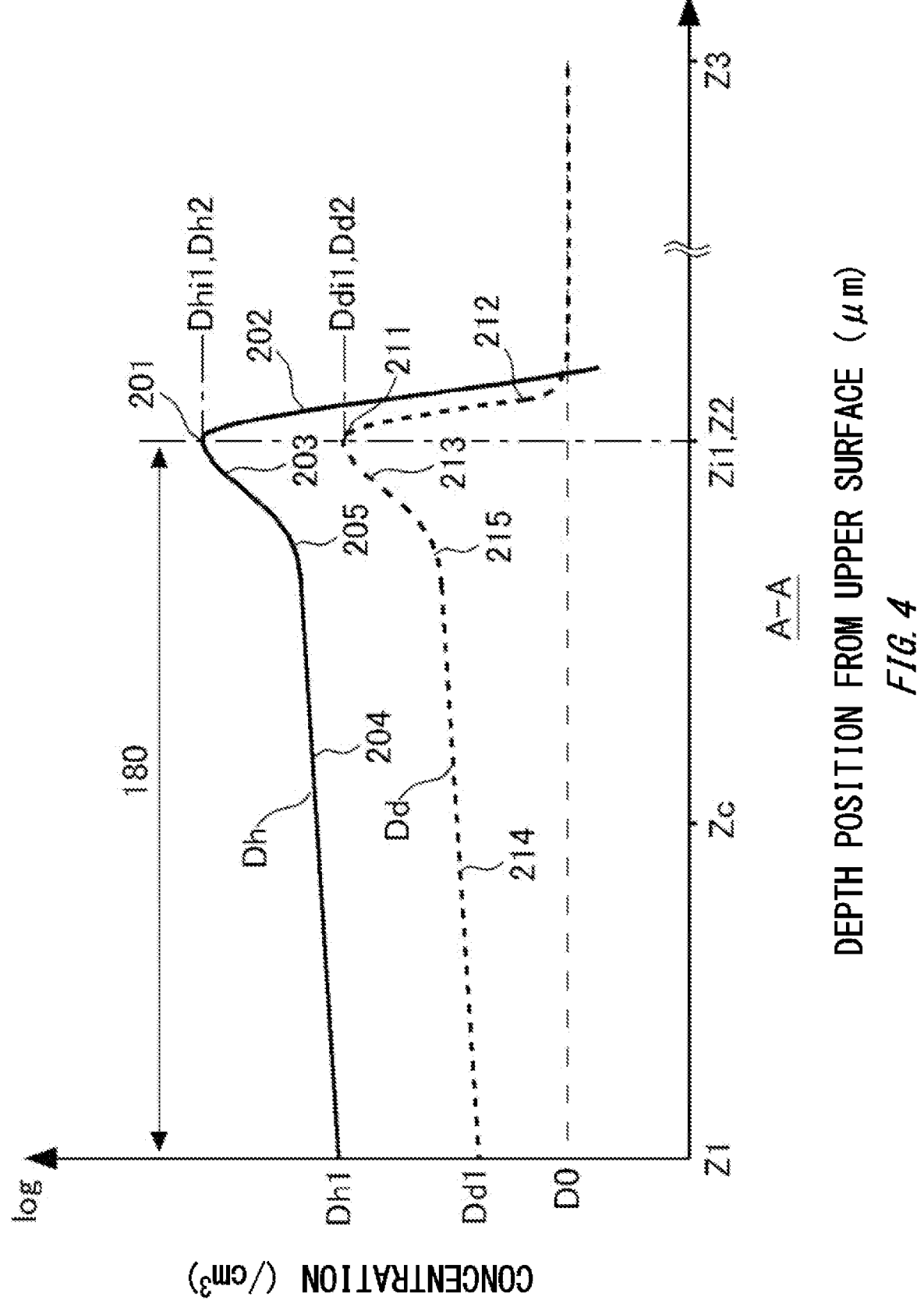
FIG. 4 illustrates another example of the distribution of the hydrogen chemical concentration Dh, the distribution of the donor concentration Dd, and the distribution of the bulk donor concentration D0 in the depth direction at the position indicated by line A-A in FIG. 1.

FIG. 4 illustrates another example of the distribution of the hydrogen chemical concentration Dh, the distribution of the donor concentration Dd, and the distribution of the bulk donor concentration D0 in the depth direction at the position indicated by line A-A in FIG. 1. In the present example, the first implantation position Zi1 coincides with the depth position Z2 of the lower surface 23. Other structures are the same as in the example of FIG. 2. In the present example, the hydrogen chemical concentration Dh2 in the lower surface 23 coincides with a hydrogen chemical concentration Dhi1 at the first hydrogen concentration peak 201. In addition, the entire region from the upper surface 21 to the lower surface 23 is the hydrogen increasing portion 180. According to the present example, since the first hydrogen concentration peak 201 is included in the semiconductor substrate 10, diffusion of hydrogen toward the upper surface 21 is facilitated. In addition, a high-concentration N-type region can be formed.

Figure 5:
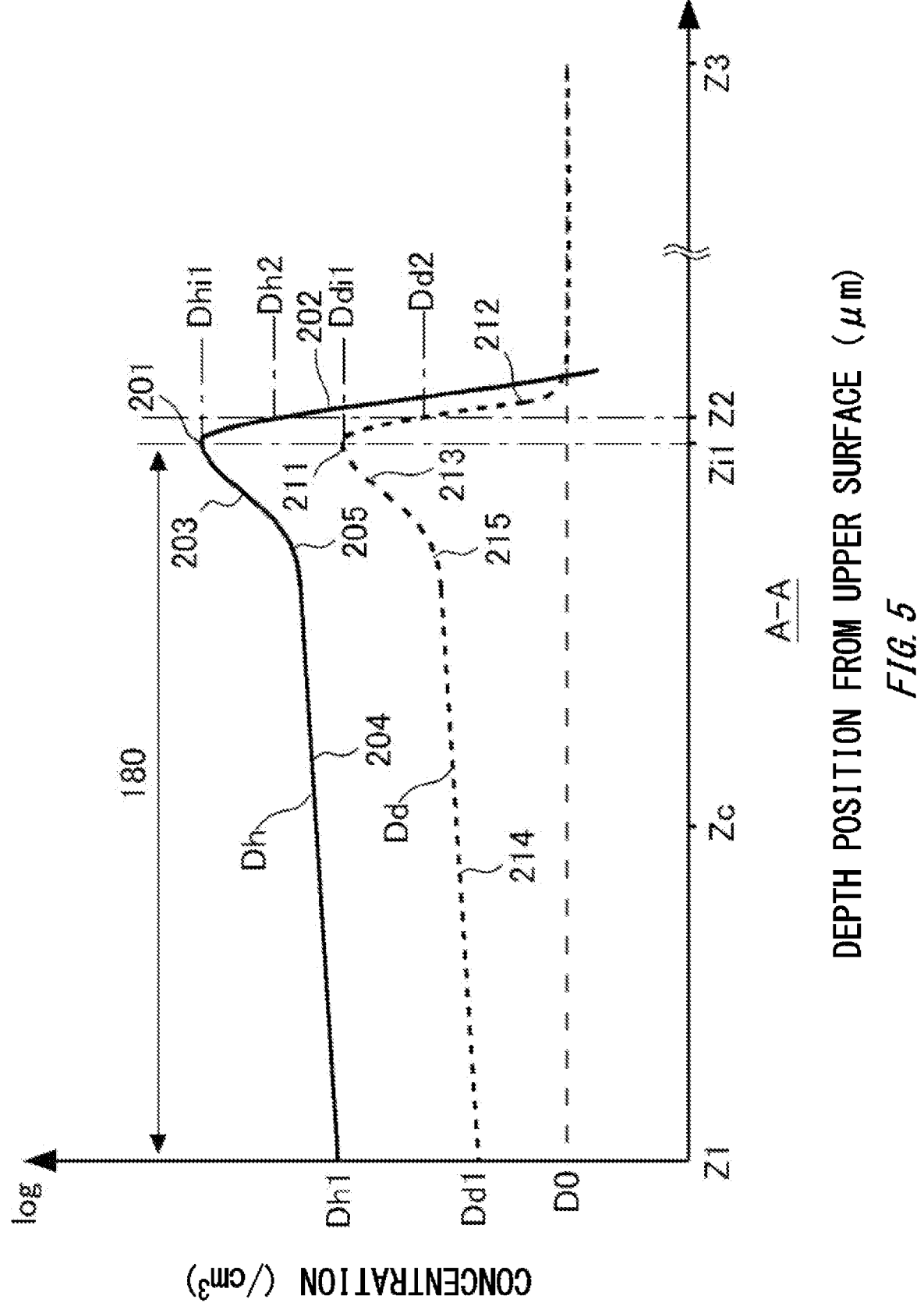
FIG. 5 illustrates another example of the distribution of the hydrogen chemical concentration Dh, the distribution of the donor concentration Dd, and the distribution of the bulk donor concentration D0 in the depth direction at the position indicated by line A-A in FIG. 1.

FIG. 5 illustrates another example of the distribution of the hydrogen chemical concentration Dh, the distribution of the donor concentration Dd, and the distribution of the bulk donor concentration D0 in the depth direction at the position indicated by line A-A in FIG. 1. In the present example, the first implantation position Zi1 is disposed closer to the upper surface 21 than the lower surface 23. Other structures are the same as in the example of FIG. 2. In the present example, on the lower surface 23 side of the semiconductor substrate 10, the hydrogen chemical concentration Dh has the lower tail 202, the first hydrogen concentration peak 201, and the upper tail 203. The depth position Z2 of the lower surface 23 may be disposed within a range where the lower tail 202 is provided. In this case, only a part of the lower tail 202 remains in the semiconductor substrate 10. In the present example, the hydrogen chemical concentration Dh2 in the lower surface 23 is smaller than the hydrogen chemical concentration Dhi1 at the first hydrogen concentration peak 201. According to the present example, diffusion of hydrogen toward the upper surface 21 is further facilitated. In addition, a high-concentration N-type region can be formed.

Figure 6:
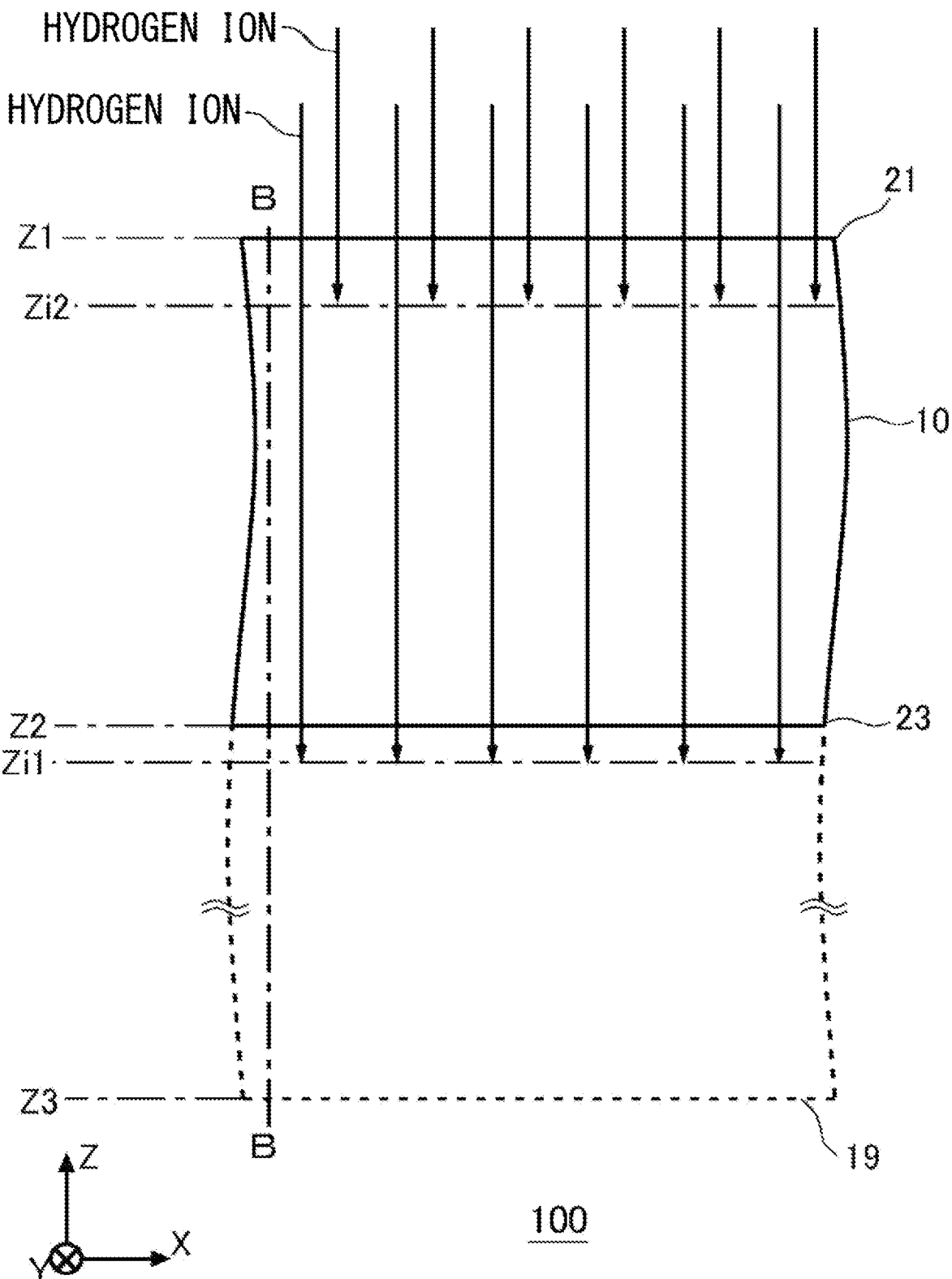
FIG. 6 is a diagram illustrating another configuration example of the semiconductor apparatus 100.

FIG. 6 is a diagram illustrating another configuration example of the semiconductor apparatus 100. The semiconductor apparatus 100 of the present example is different from the example illustrated in FIG. 1 to FIG. 5 in that hydrogen ions are also implanted into a second implantation position Zi2. Other structures are the same as those of the semiconductor apparatus 100 according to any one of the aspects described with reference to FIG. 1 to FIG. 5.

The second implantation position Zi2 of the present example is disposed on the upper surface 21 side of the semiconductor substrate 10. The second implantation position Zi2 may have a distance in the depth direction from the upper surface 21 of 5 μm or less, 10 μm or less, or 20 μm or less. In the example of FIG. 6, hydrogen ions are implanted from the upper surface 21 to the second implantation position Zi2. In another example, hydrogen ions may be implanted from the lower surface 23 to the second implantation position Zi2.

Hydrogen can be diffused from the second implantation position Zi2 toward the lower surface 23 by implanting hydrogen ions into the second implantation position Zi2 and then performing heat treatment. As a result, it is possible to supply hydrogen having a sufficient concentration to the pass-through region of hydrogen ions when hydrogen ions are implanted into the first implantation position Zi1. Therefore, a hydrogen donor can be easily formed.

Figure 7:
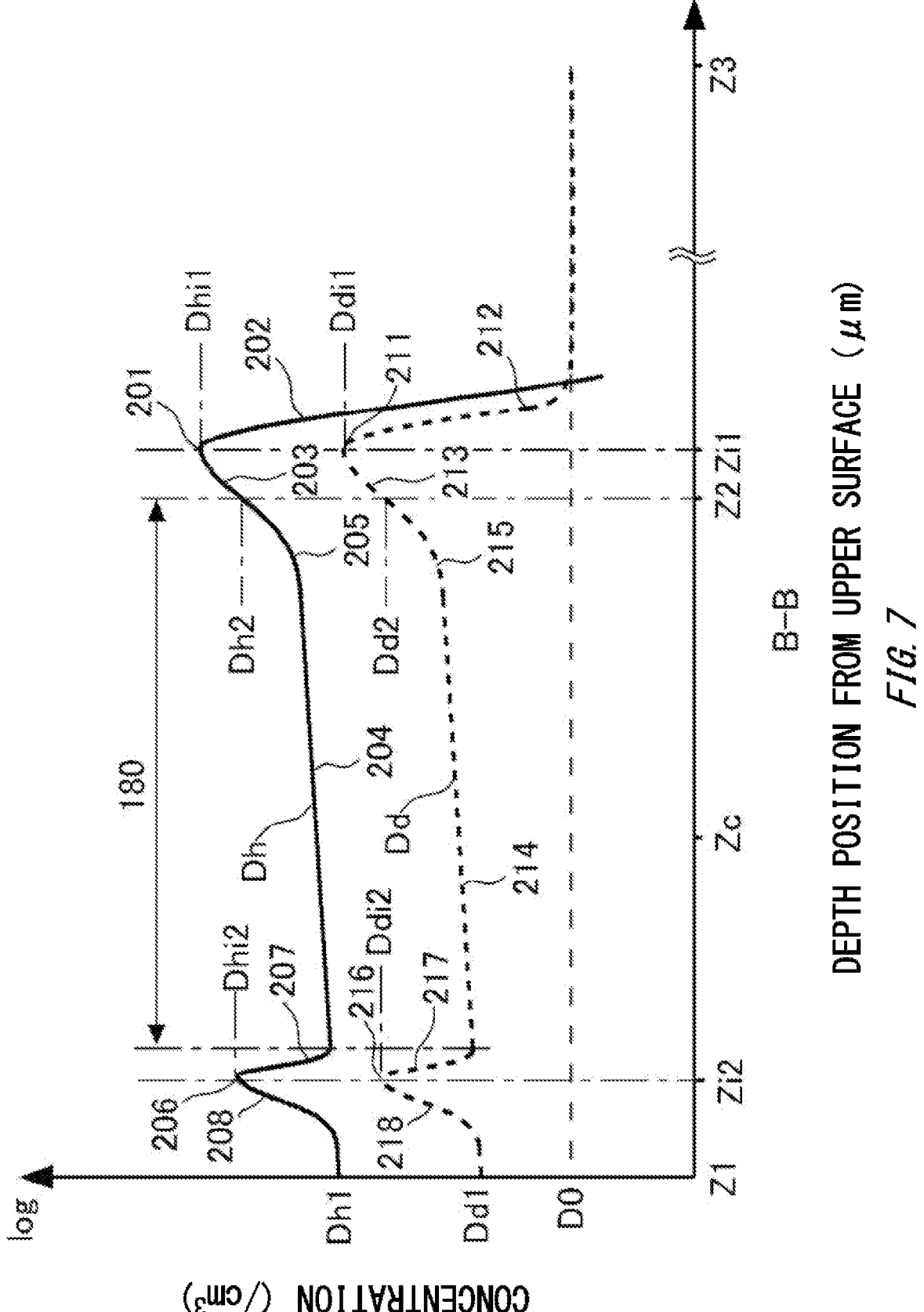
FIG. 7 illustrates an example of a distribution of a hydrogen chemical concentration Dh, a distribution of a donor concentration Dd, and a distribution of a bulk donor concentration D0 in a depth direction at a position indicated by line B-B in FIG. 6.

FIG. 7 illustrates an example of the distribution of the hydrogen chemical concentration Dh, the distribution of the donor concentration Dd, and the distribution of the bulk donor concentration D0 in the depth direction at the position indicated by line B-B in FIG. 6. The semiconductor substrate 10 of the present example has a second hydrogen concentration peak 206 and a second donor concentration peak 216 at the second implantation position Zi2. The distribution of the hydrogen chemical concentration Dh has a lower tail 207 extending from the second hydrogen concentration peak 206 toward the lower surface 23 and an upper tail 208 extending from the second hydrogen concentration peak 206 toward the upper surface 21. The full width at half maximum of the second hydrogen concentration peak 206 may be 1/10 or less of the thickness of the semiconductor substrate 10. Since hydrogen ions are implanted from the upper surface 21 to the second implantation position Zi2, the lower tail 207 has a steeper change in hydrogen chemical concentration than the upper tail 208. The distribution of the donor concentration Dd has a lower tail 217 extending from the second donor concentration peak 216 toward the lower surface 23 and an upper tail 218 extending from the second donor concentration peak 216 toward the upper surface 21. The lower tail 217 has a steeper change in donor concentration than the upper tail 218. Other structures are the same as those of the semiconductor apparatus 100 according to any one of the aspects described with reference to FIG. 1 to FIG. 5.

A hydrogen chemical concentration Dhi2 at the second hydrogen concentration peak 206 may be larger or smaller than the hydrogen chemical concentration Dh2 in the lower surface 23. By increasing the hydrogen chemical concentration Dhi2 of the second hydrogen concentration peak 206, hydrogen is easily diffused toward the lower surface 23 side. In addition, by reducing the hydrogen chemical concentration Dhi2 of the second hydrogen concentration peak 206, the concentration of lattice defects formed in the vicinity of the second implantation position Zi2 can be reduced. The hydrogen chemical concentration Dhi2 of the second hydrogen concentration peak 206 may be 10 times or more the hydrogen chemical concentration Dh2 in the lower surface 23. The hydrogen chemical concentration Dhi2 of the second hydrogen concentration peak 206 may be larger or smaller than the hydrogen chemical concentration Dhi1 of the first hydrogen concentration peak 201.

A donor concentration Ddi2 of the second donor concentration peak 216 may be larger or smaller than the donor concentration Dd2 in the lower surface 23. The donor concentration Ddi2 of the second donor concentration peak 216 may be 10 times or more the donor concentration Dd2 in the lower surface 23.

The second hydrogen concentration peak 206 is disposed in a region other than the hydrogen increasing portion 180. In the present example, the hydrogen increasing portion 180 is provided from the second hydrogen concentration peak 206 to the lower surface 23. In addition, the hydrogen chemical concentration Dh monotonically increases from the upper surface 21 to the lower surface 23 except for a portion where the local second hydrogen concentration peak 206 (including the upper tail 208 and the lower tail 207) is provided.

Figure 8A:
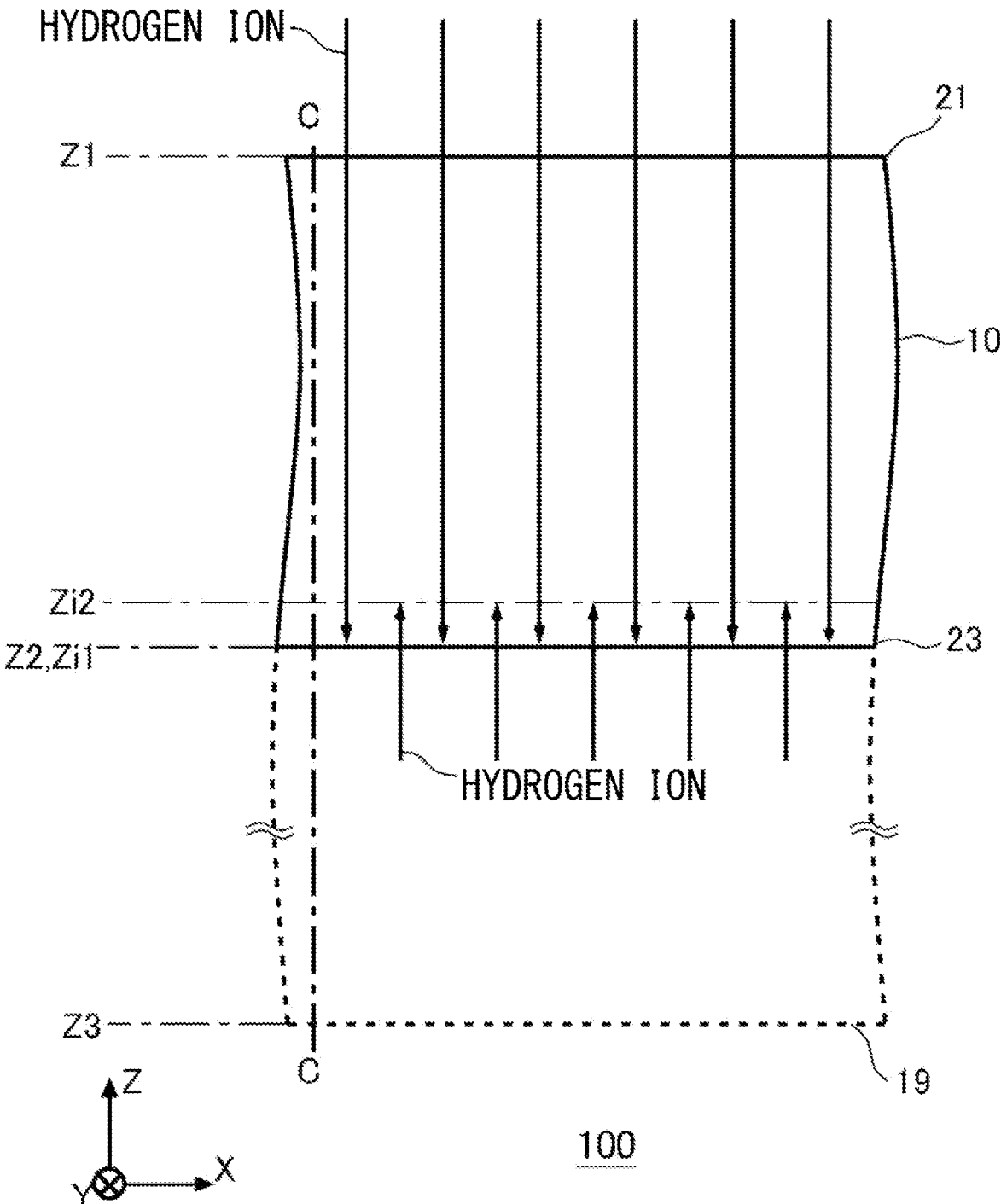
FIG. 8A is a diagram illustrating another configuration example of the semiconductor apparatus 100.

FIG. 8A is a diagram illustrating another configuration example of the semiconductor apparatus 100. The semiconductor apparatus 100 of the present example is different from the example illustrated in FIG. 1 to FIG. 5 in that hydrogen ions are also implanted into a second implantation position Zi2. Other structures are the same as those of the semiconductor apparatus 100 according to any one of the aspects described with reference to FIG. 1 to FIG. 5.

The second implantation position Zi2 of the present example is disposed on the lower surface 23 side of the semiconductor substrate 10. The second implantation position Zi2 may have a distance in the depth direction from the lower surface 23 of 5 μm or less, 10 μm or less, or 20 μm or less. The second implantation position Zi2 may be disposed between the first implantation position Zi1 and the upper surface 21. The second implantation position Zi2 may have a distance in the depth direction from the first implantation position Zi1 of 1 μm or less, 5 μm or less, or 10 μm or less. The second implantation position Zi2 may coincide with the first implantation position Zi1. The second implantation position Zi2 may be located on the lower surface side of the first implantation position Zi1.

Hydrogen can be diffused from the second implantation position Zi2 toward the upper surface 21 by implanting hydrogen ions into the second implantation position Zi2 and then performing heat treatment. As a result, it is possible to supply hydrogen having a sufficient concentration to the pass-through region of hydrogen ions when hydrogen ions are implanted into the first implantation position Zi1. Therefore, a hydrogen donor can be easily formed.

Figure 8B:
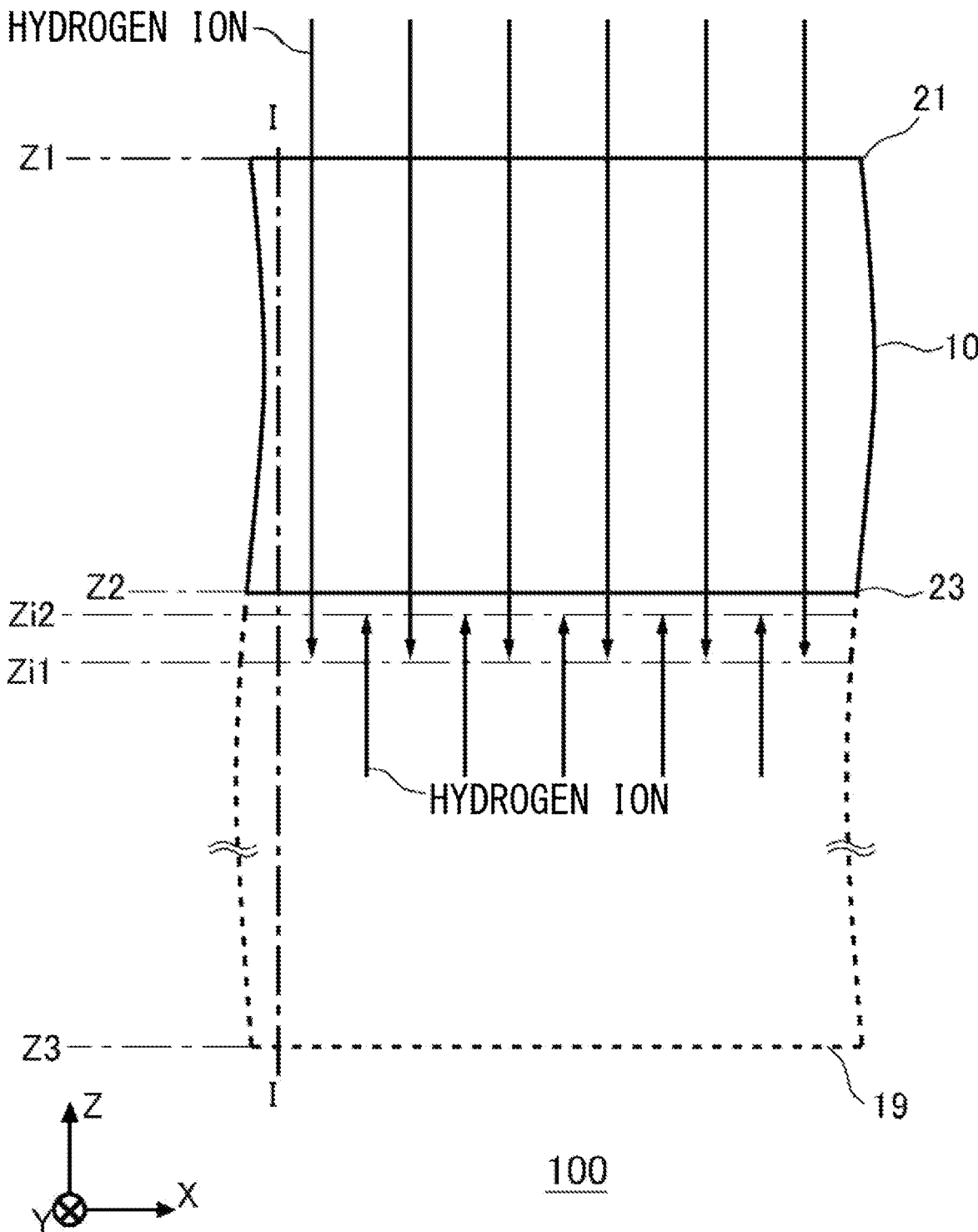
FIG. 8B is a diagram illustrating another configuration example of the semiconductor apparatus 100.

FIG. 8B is a diagram illustrating another configuration example of the semiconductor apparatus 100. The semiconductor apparatus 100 of the present example is different from the example of FIG. 8A in that the position of the lower surface 23 is disposed closer to the upper surface 21 than either the first implantation position Zi1 or the second implantation position Zi2. Other structures are the same as the example of FIG. 8A. In the present example, after hydrogen is diffused by heat treatment, the lower surface 19 is ground. As a result, a high concentration of hydrogen at the first implantation position Zi1 and the second implantation position Zi2 does not remain on the semiconductor substrate 10 after grinding.

Figure 9A:
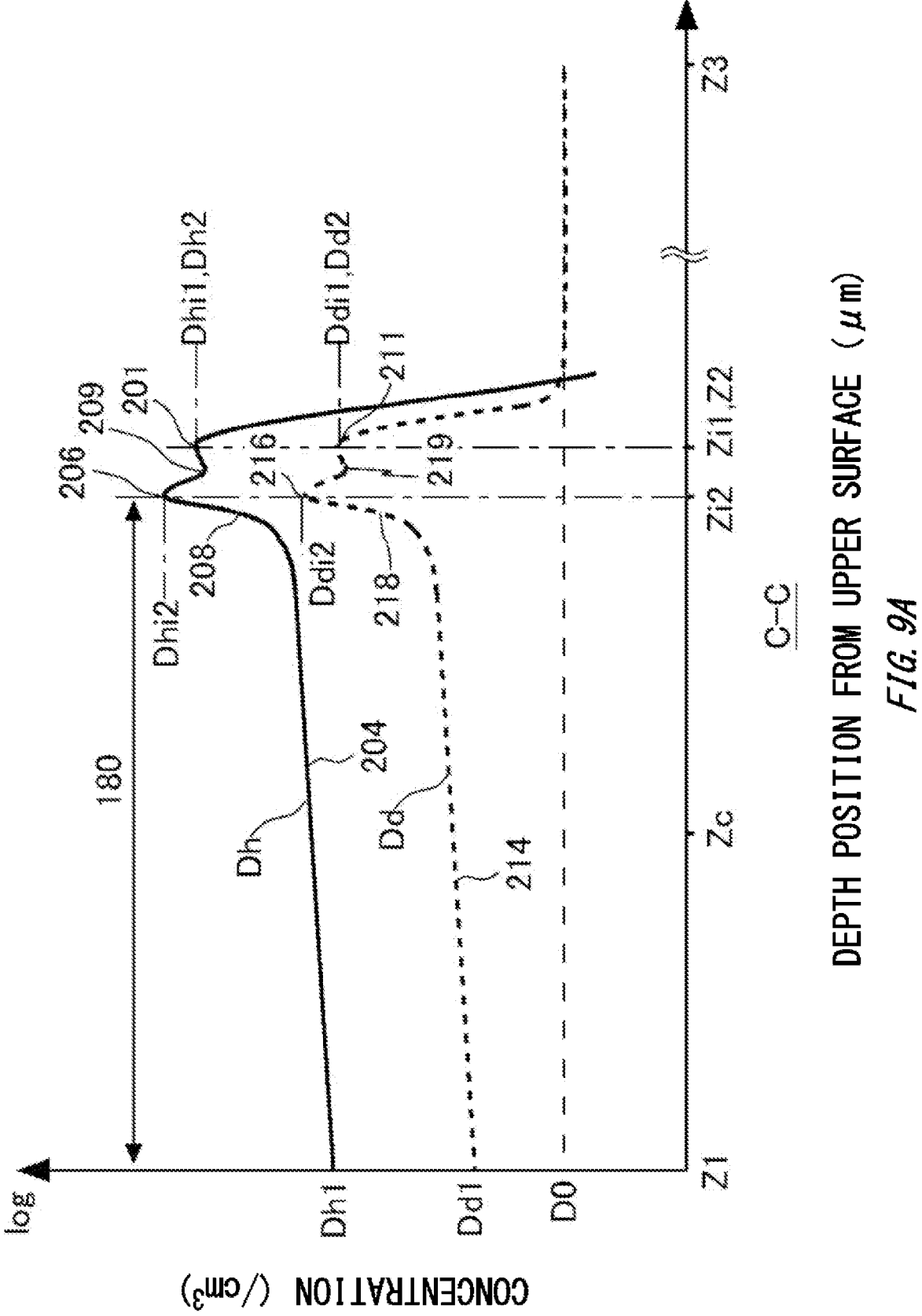
FIG. 9A illustrates an example of a distribution of a hydrogen chemical concentration Dh, a distribution of a donor concentration Dd, and a distribution of a bulk donor concentration D0 in a depth direction at a position indicated by line C-C in FIG. 8A.

FIG. 9A illustrates an example of the distribution of hydrogen chemical concentration Dh, the distribution of donor concentration Dd, and the distribution of bulk donor concentration D0 in the depth direction at the position indicated by line C-C in FIG. 8A. The semiconductor substrate 10 of the present example has a second hydrogen concentration peak 206 and a second donor concentration peak 216 at the second implantation position Zi2. In addition, between the second implantation position Zi2 and the first implantation position Zi1, there are a valley portion 209 of the hydrogen chemical concentration and a valley portion 219 of the donor concentration. The valley portion is a portion where the concentration becomes a minimal value.

A hydrogen chemical concentration Dhi2 at the second hydrogen concentration peak 206 may be larger or smaller than the hydrogen chemical concentration Dh2 in the lower surface 23. The hydrogen chemical concentration Dhi2 of the second hydrogen concentration peak 206 may be larger or smaller than the hydrogen chemical concentration Dhi1 of the first hydrogen concentration peak 201. The hydrogen chemical concentration Dhi2 at the second hydrogen concentration peak 206 may be 10 times or more the hydrogen chemical concentration Dh2 in the lower surface 23, and may be 10 times or more the hydrogen chemical concentration Dhi1 at the first hydrogen concentration peak 201.

The first hydrogen concentration peak 201 and the second hydrogen concentration peak 206 may be disposed so as to overlap each other. The fact that the peaks overlap each other may indicate that the local maximum of one peak is disposed within the full width at half maximum of the other peak. The first hydrogen concentration peak 201 and the second hydrogen concentration peak 206 may overlap each other in a case where the hydrogen chemical concentration of the valley portion 209 is half or more of the lower one of the hydrogen chemical concentration Dhi1 and the hydrogen chemical concentration Dhi2.

A donor concentration Ddi2 of the second donor concentration peak 216 may be larger or smaller than the donor concentration Dd2 in the lower surface 23. The donor concentration Ddi2 of the second donor concentration peak 216 may be 10 times or more the donor concentration Dd2 in the lower surface 23, or may be 10 times or more the first donor concentration peak 211.

Figure 9B:
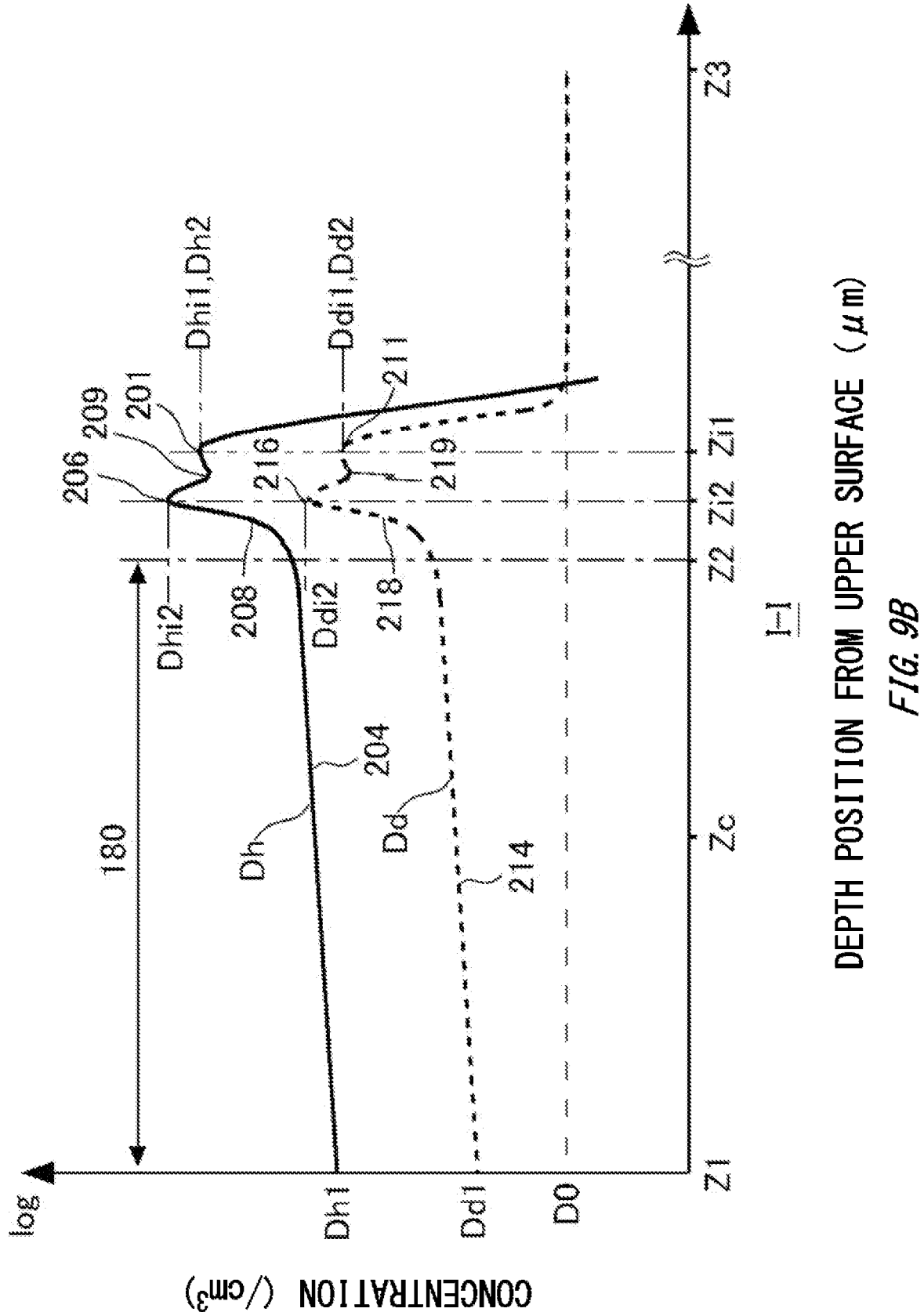
FIG. 9B illustrates an example of a distribution of a hydrogen chemical concentration Dh, a distribution of a donor concentration Dd, and a distribution of a bulk donor concentration D0 in a depth direction at a position indicated by line I-I in FIG. 8B.

FIG. 9B illustrates an example of the distribution of the hydrogen chemical concentration Dh, the distribution of donor concentration Dd, and the distribution of bulk donor concentration D0 in the depth direction at the position indicated by line I-I in FIG. 8B. As described with reference to FIG. 8B, the depth position Z2 in the present example may be closer to the upper surface 21 than the positions of the first hydrogen concentration peak 201 and the second hydrogen concentration peak 206.

Figure 10A:
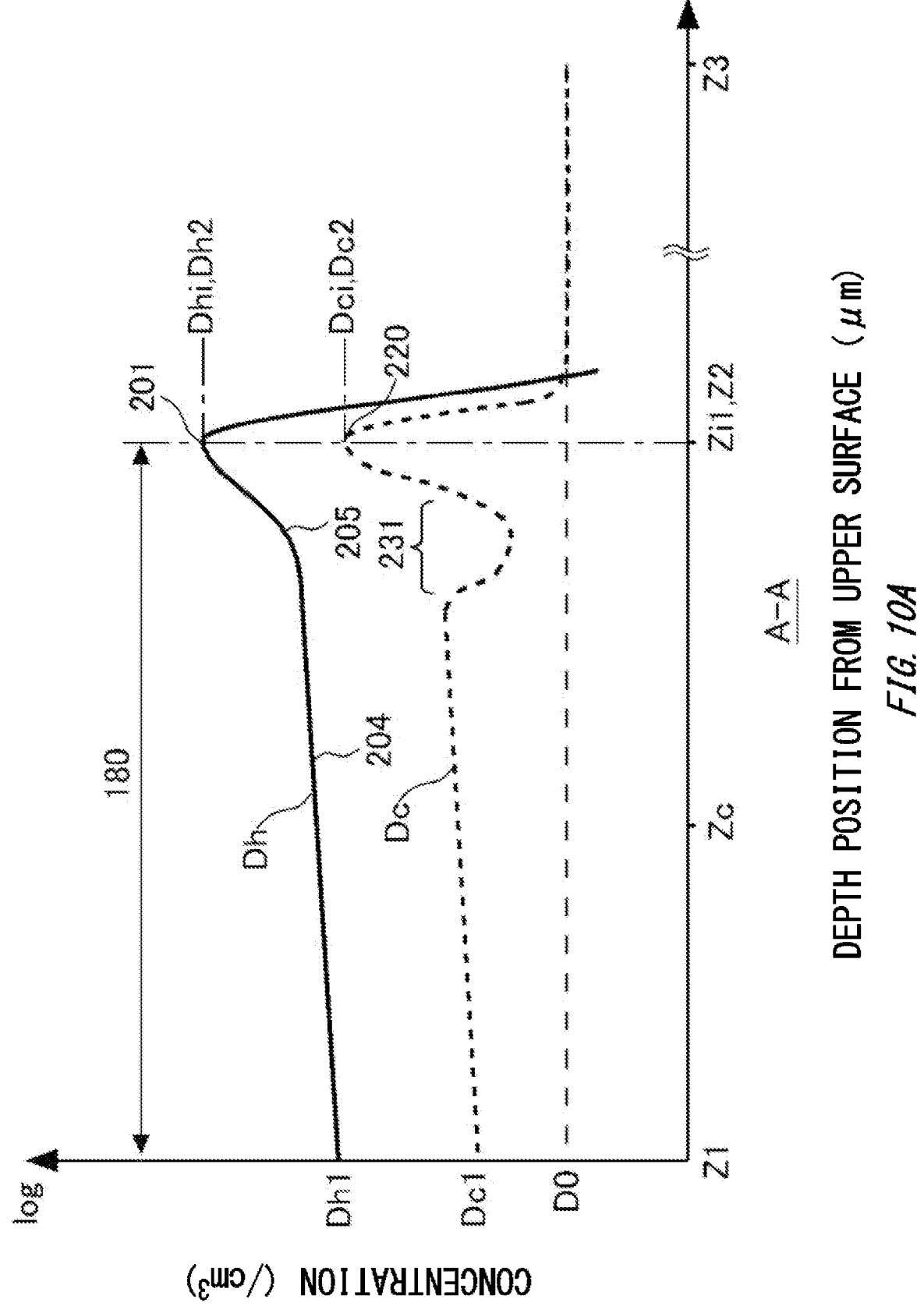
FIG. 10A is a diagram illustrating a distribution example of a hydrogen chemical concentration Dh and a carrier concentration Dc in the A-A cross section of FIG. 1.

FIG. 10A is a diagram illustrating a distribution example of the hydrogen chemical concentration Dh and a carrier concentration Dc in the A-A cross section of FIG. 1. The distribution of the hydrogen chemical concentration Dh may be identical to the example of FIG. 2, or FIG. 4, or FIG. 5. The semiconductor apparatus 100 of the present example includes a lifetime adjustment portion 231 in the hydrogen increasing portion 180. The lifetime adjustment portion 231 is a portion in which the density distribution of lifetime killers such as lattice defects exhibits a maximal value. The lifetime killer shortens the lifetime of the carrier by combining with holes or electrons. In addition, the lifetime adjustment portion 231 may be a portion in which the lifetime of the carrier indicates the minimal value.

By implanting hydrogen ions from the upper surface 21 to the first implantation position Zi1, lattice defects are formed in a region through which the hydrogen ions have passed. In particular, lattice defects are formed at a high density around the first implantation position Zi1. However, since hydrogen is also present at a high concentration in the vicinity of the first implantation position Zi1, lattice defects and hydrogen are bonded to form a hydrogen donor. Therefore, at the first implantation position Zi1, the carrier concentration Dc has a carrier concentration peak 220. On the other hand, since the hydrogen chemical concentration is relatively low in the region closer to the upper surface 21 than the first implantation position Zi1, a large number of lattice defects may remain. Therefore, the carrier concentration Dc may include the lifetime adjustment portion 231 in contact with the carrier concentration peak 220.

Figure 10B:
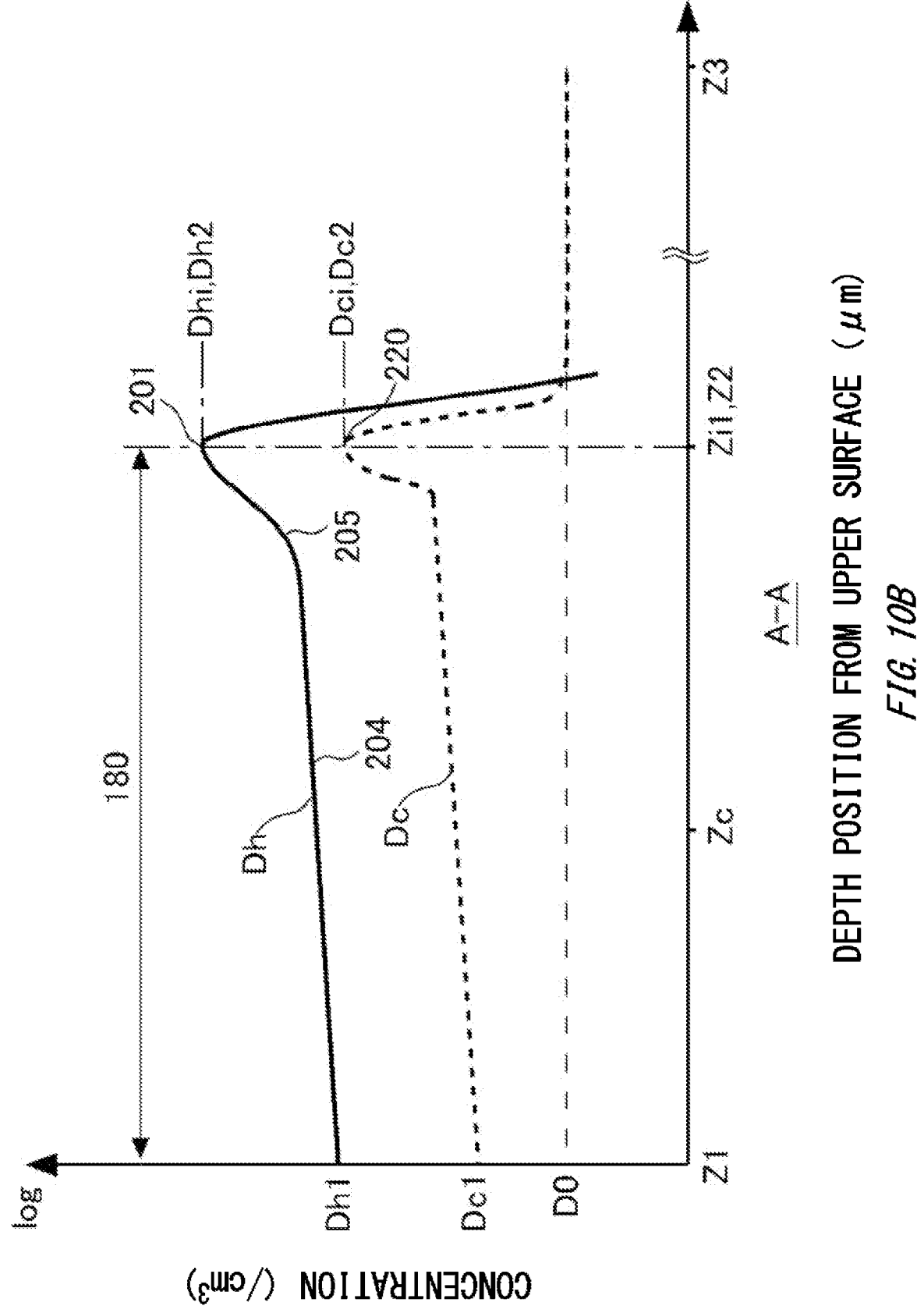
FIG. 10B is another diagram illustrating each distribution example of the hydrogen chemical concentration Dh and the carrier concentration Dc in the A-A cross section of FIG. 1.

FIG. 10B is another diagram illustrating each distribution example of the hydrogen chemical concentration Dh and the carrier concentration Dc in the A-A cross section of FIG. 1. FIG. 10B is different from FIG. 10A in that the carrier concentration Dc does not decrease in the region on the upper surface 21 side of the carrier concentration peak 220 and the carrier lifetime adjustment portion 231 is not provided. In the present example, the lifetime of the carrier may not have the minimal value. It is assumed that the carrier concentration in the lower surface 23 is Dc2 and the carrier concentration at the first implantation position Zi1 is Dci (Dc2=Dci in the example of FIG. 10B). The carrier concentrations Dc2 and Dci may be the same as the donor concentrations Dd2 and Ddi.

Figure 11A:
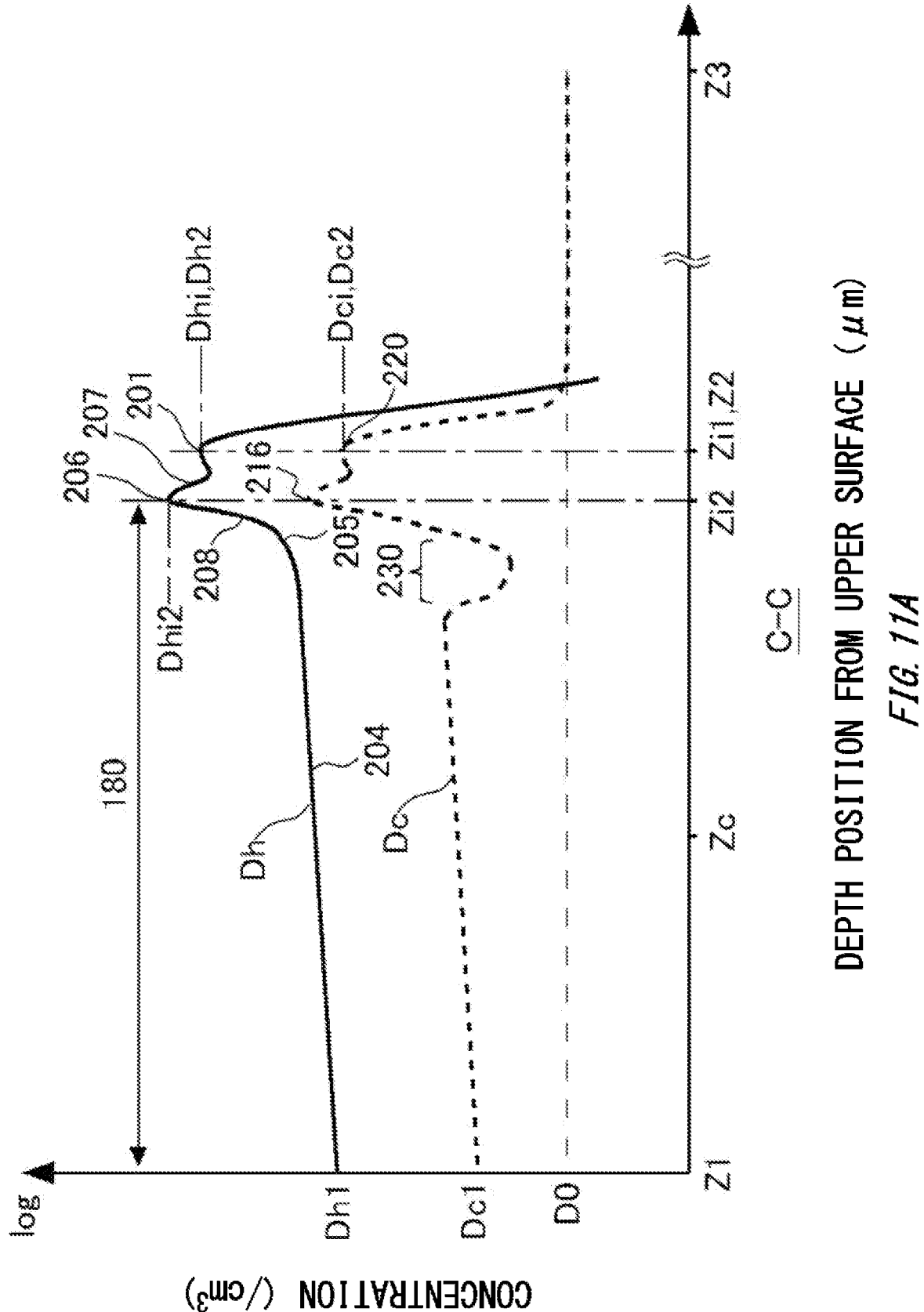
FIG. 11A is a diagram illustrating a distribution example of a hydrogen chemical concentration Dh and a carrier concentration Dc in a C-C cross section of FIG. 8A.

FIG. 11A is a diagram illustrating distribution examples of a hydrogen chemical concentration Dh and a carrier concentration Dc in a cross section taken along line C-C in FIG. 8A. The distribution of the hydrogen chemical concentration Dh may be the same as in the example of FIG. 9A. In the present example, the second hydrogen concentration peak 206 is disposed in contact with the first hydrogen concentration peak 201. By providing the second hydrogen concentration peak 206, lattice defects in the vicinity of the second hydrogen concentration peak 206 are bonded to hydrogen to form hydrogen donors. Therefore, the carrier lifetime in the vicinity of the second hydrogen concentration peak 206 is recovered. In the present example, after the lower surface 19 is ground, hydrogen ions may be implanted from the lower surface 23 to the second implantation position Zi2. As a result, the acceleration energy of hydrogen ions to the second implantation position Zi2 can be reduced, and the formation of lattice defects due to the implantation of hydrogen ions to the second implantation position Zi2 can be suppressed.

A lifetime adjustment portion 230 of the present example is provided in contact with the second hydrogen concentration peak 206 on the upper surface 21 side with respect to the second hydrogen concentration peak 206. By providing the second hydrogen concentration peak 206, the length in the depth direction of the lifetime adjustment portion 230 can be adjusted. Therefore, the distribution of the carrier lifetime in the depth direction can be easily controlled. In general, the lifetime killer is formed by irradiating particles other than hydrogen such as helium. In the present example, the lifetime adjustment portion 230 can be formed by irradiating hydrogen. Therefore, the lifetime adjustment portion 230 of the present example does not include helium.

Hydrogen ions are implanted into the second implantation position Zi2 from the lower surface side of the semiconductor substrate 10. Therefore, the hydrogen chemical concentration of the upper tail 208 of the second hydrogen concentration peak 206 may change more steeply than the hydrogen chemical concentration of the lower tail 207. In the present example, the hydrogen chemical concentration monotonically increases from the lower end of the gate trench portion 40 to the upper end of the upper tail 208.

Figure 11B:
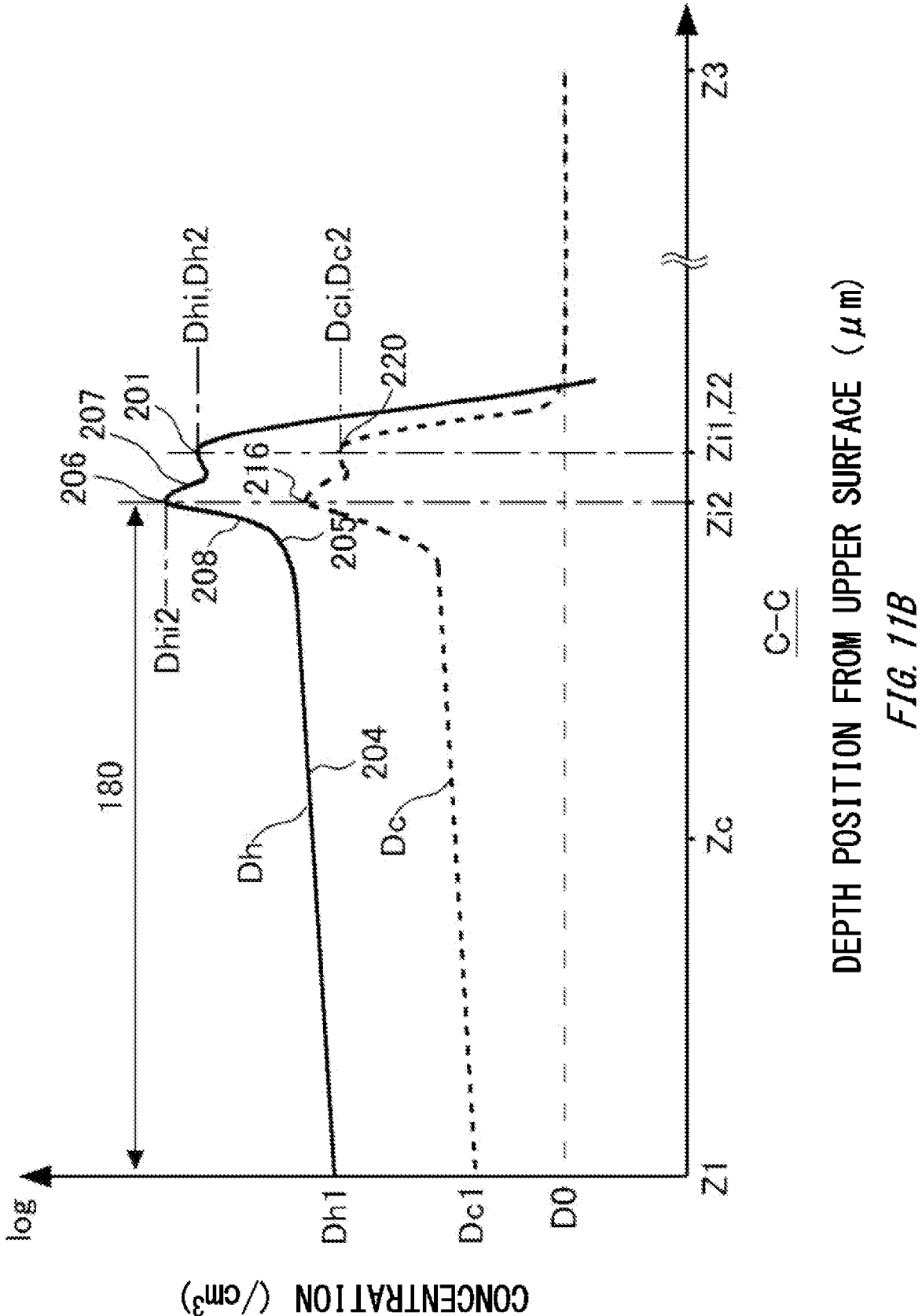
FIG. 11B is another diagram illustrating each distribution example of the hydrogen chemical concentration Dh and the carrier concentration Dc in the C-C cross section of FIG. 8A.

FIG. 11B is another diagram illustrating each distribution example of the hydrogen chemical concentration Dh and the carrier concentration Dc in the C-C cross section of FIG. 8A. FIG. 11B is different from FIG. 11A in that the carrier concentration Dc does not decrease in the region on the upper surface 21 side of the carrier concentration peak 220 and the carrier lifetime adjustment portion 230 is not provided. In the present example, the lifetime of the carrier may not have the minimal value.

Figure 12:
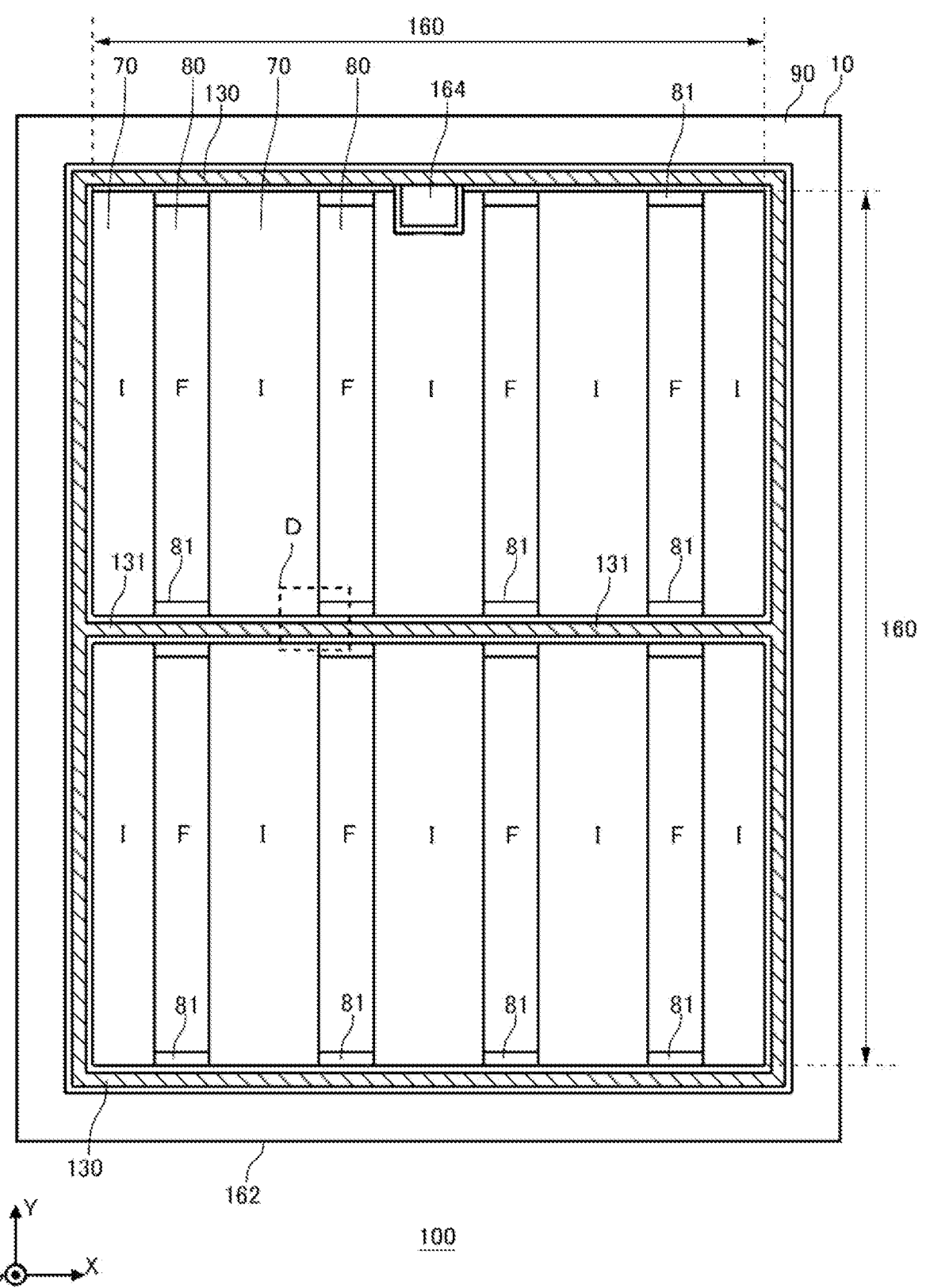
FIG. 12 is a top view illustrating an example of the semiconductor apparatus 100.

FIG. 12 is a top view illustrating an example of the semiconductor apparatus 100. FIG. 12 illustrates a position where each member is projected on the upper surface of the semiconductor substrate 10. In FIG. 12, only some members of the semiconductor apparatus 100 are illustrated, and some members are omitted.

The semiconductor apparatus 100 includes the semiconductor substrate 10. The semiconductor substrate 10 may have the hydrogen chemical concentration distribution, the donor concentration distribution, and the carrier concentration distribution described in FIG. 1 to FIG. 11B. However, the semiconductor substrate 10 may further have another concentration peak different from each concentration peak described in FIG. 1 to FIG. 11B. As in a buffer region 20 to be described later, hydrogen ions may be implanted to form an N type region in the semiconductor substrate 10. In this case, the hydrogen chemical concentration distribution may have a local hydrogen concentration peak in addition to the distribution of the hydrogen chemical concentration Dh described in FIG. 1 to FIG. 11B. In addition, as in an emitter region 12 to be described later, an N type impurity such as phosphorus other than hydrogen may be implanted to form an N type region in the semiconductor substrate 10. In this case, the donor concentration distribution may have a local donor concentration peak in addition to the donor concentration distribution described in FIG. 1 to FIG. 11B. In addition, as in a base region 14 to be described later, a P type impurity such as boron may be implanted to form a P type region in the semiconductor substrate 10. In this case, the carrier concentration distribution may have a local carrier concentration peak in addition to the carrier concentration distribution described in FIG. 10A to FIG. 11B.

The semiconductor substrate 10 has an end side 162 in a top view. In the present specification, when simply referred to as a top view, it means viewing from the upper surface side of the semiconductor substrate 10. The semiconductor substrate 10 of the present example has two sets of end sides 162 facing each other in a top view. In FIG. 12, the X axis and the Y axis are parallel to one of the end sides 162. The Z axis is perpendicular to the upper surface of the semiconductor substrate 10.

The semiconductor substrate 10 is provided with an active portion 160. The active portion 160 is a region through which a main current flows in the depth direction between the upper surface and the lower surface of the semiconductor substrate 10 in a case where the semiconductor apparatus 100 operates. An emitter electrode is provided above the active portion 160, but is omitted in FIG. 12.

In the active portion 160, there is provided at least one of a transistor portion 70 which includes a transistor device such as an IGBT, and a diode portion 80 which includes a diode device such as a freewheeling diode (FWD). In the example of FIG. 12, the transistor portion 70 and the diode portion 80 are disposed alternately along a predetermined arrangement direction (the X axis direction in the present example) in the upper surface of the semiconductor substrate 10. In another example, only one of the transistor portion 70 and the diode portion 80 may be provided in the active portion 160.

In FIG. 12, a region where the transistor portion 70 is disposed is denoted by a symbol "I", and a region where the diode portion 80 is disposed is denoted by a symbol F. In the present specification, a direction perpendicular to the arrangement direction in a top view may be referred to as an extending direction (Y axis direction in FIG. 12). Each of the transistor portion 70 and the diode portion 80 may have a longitudinal length in the extending direction. That is, the length of the transistor portion 70 in the Y axis direction is larger than the width thereof in the X axis direction. Similarly, the length of the diode portion 80 in the Y axis direction is larger than the width thereof in the X axis direction. The extending direction of the transistor portion 70 and the diode portion 80 may be the same as the longitudinal direction of each trench portion to be described later.

The diode portion 80 has an N+ type cathode region in a region in contact with the lower surface of the semiconductor substrate 10. In the present specification, a region where the cathode region is provided is referred to as a diode portion 80. That is, the diode portion 80 is a region overlapping the cathode region in a top view. On the lower surface of the semiconductor substrate 10, a P+ type collector region may be provided in a region other than the cathode region. In the present specification, an extension region 81 obtained by extending the diode portion 80 in the Y axis direction to a gate runner to be described later may also be included in the diode portion 80. A collector region is provided in a lower surface of the extension region 81.

The transistor portion 70 has a P+ type collector region in a region in contact with the lower surface of the semiconductor substrate 10. In the transistor portion 70, a gate structure including an N type emitter region, a P type base region, a gate conductive portion, and a gate insulating film is periodically disposed on the upper surface side of the semiconductor substrate 10.

The semiconductor apparatus 100 may have one or more pads above the semiconductor substrate 10. The semiconductor apparatus 100 of the present example includes a gate pad 164. The semiconductor apparatus 100 may have pads such as an anode pad, a cathode pad, and a current detection pad. Each pad is disposed in the vicinity of the end side 162. The vicinity of the end side 162 refers to a region between the end side 162 and the emitter electrode in a top view. At the time of mounting the semiconductor apparatus 100, each pad may be connected to an external circuit via wiring such as a wire.

A gate potential is applied to the gate pad 164. The gate pad 164 is electrically connected to the conductive portion of the gate trench portion of the active portion 160. The semiconductor apparatus 100 includes a gate runner that connects the gate pad 164 and the gate trench portion. In FIG. 12, the gate runner is hatched with oblique lines.

The gate runner of the present example includes an outer peripheral gate runner 130 and an active-side gate runner 131. The outer peripheral gate runner 130 is disposed between the active portion 160 and the end side 162 of semiconductor substrate 10 in a top view. The outer peripheral gate runner 130 of the present example surrounds the active portion 160 in a top view. A region surrounded by the outer peripheral gate runner 130 in a top view may be the active portion 160. The outer peripheral gate runner 130 is connected to the gate pad 164. The outer peripheral gate runner 130 is disposed above the semiconductor substrate 10. The outer peripheral gate runner 130 may be a metal wiring containing aluminum or the like.

The active-side gate runner 131 is provided in the active portion 160. By providing the active-side gate runner 131 in the active portion 160, it is possible to reduce a variation in wiring length from the gate pad 164 in each region of the semiconductor substrate 10.

The active-side gate runner 131 is connected to the gate trench portion of the active portion 160. The active-side gate runner 131 is disposed above the semiconductor substrate 10. The active-side gate runner 131 may be a wiring formed of a semiconductor such as polysilicon doped with impurities.

The active-side gate runner 131 may be connected to the outer peripheral gate runner 130. The active-side gate runner 131 of the present example is provided to extend in the X axis direction from one outer peripheral gate runner 130 to the other outer peripheral gate runner 130 so as to cross the active portion 160 at substantially the center in the Y axis direction. In a case where the active portion 160 is divided by the active-side gate runner 131, the transistor portion 70 and the diode portion 80 may be alternately disposed in the X axis direction in each divided region.

In addition, the semiconductor apparatus 100 may be provided with a temperature sense portion (not illustrated) which is a PN junction diode formed of polysilicon or the like, and a current detection portion (not illustrated) which simulates the operation of the transistor portion provided in the active portion 160.

The semiconductor apparatus 100 of the present example includes an edge termination structure portion 90 between the active portion 160 and the end side 162 in a top view. The edge termination structure portion 90 of the present example is disposed between the outer peripheral gate runner 130 and the end side 162. The edge termination structure portion 90 reduces electric field strength on the upper surface side of the semiconductor substrate 10. The edge termination structure portion 90 may include at least one of a guard ring, a field plate, and a RESURF annularly provided surrounding the active portion 160.

Figure 13:
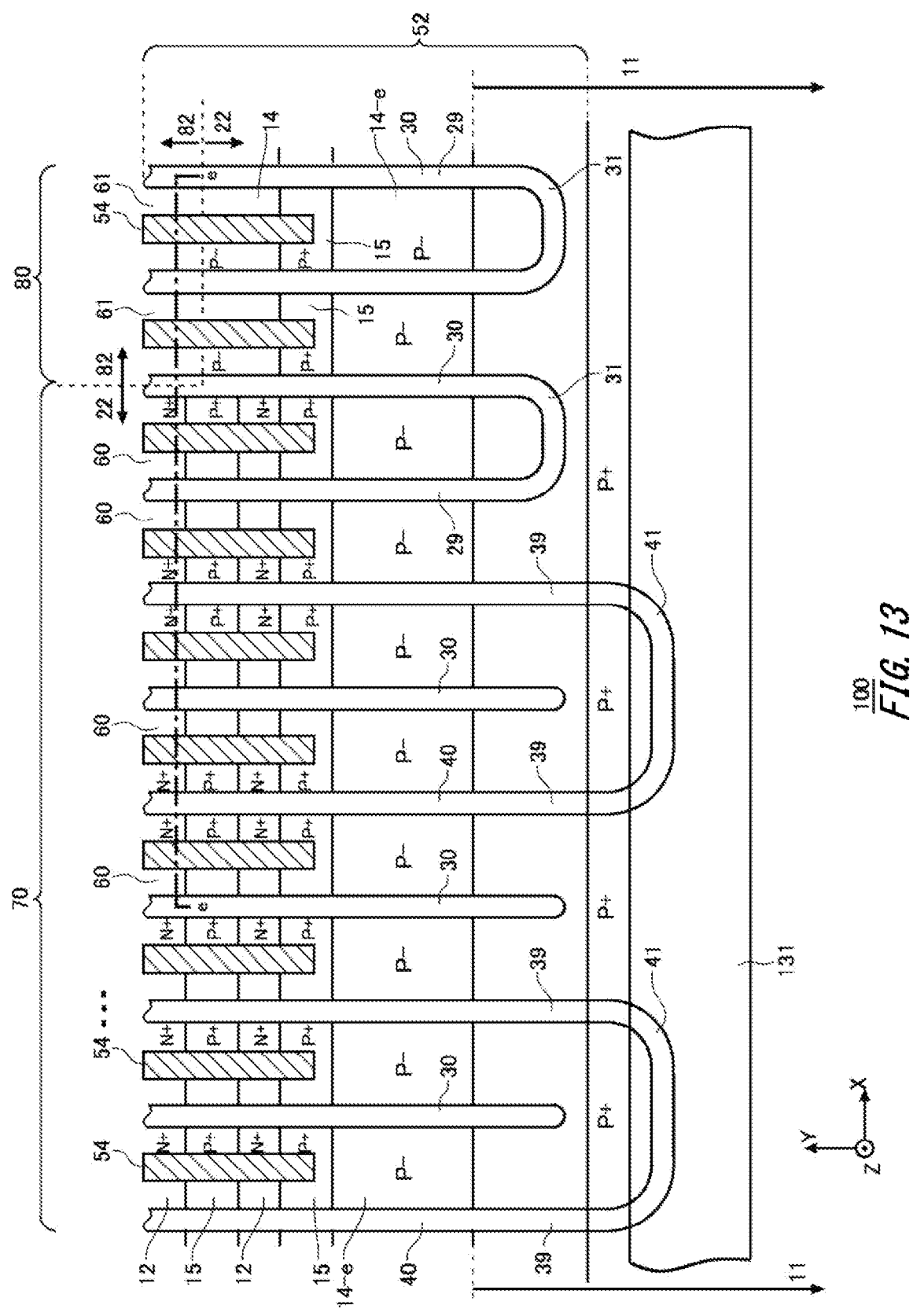
FIG. 13 is an enlarged view of a region D in FIG. 12.

FIG. 13 is an enlarged view of a region D in FIG. 12. The region D is a region including the transistor portion 70, the diode portion 80, and the active-side gate runner 131. The semiconductor apparatus 100 of the present example includes a gate trench portion 40, a dummy trench portion 30, a well region 11, an emitter region 12, a base region 14, and a contact region 15 provided inside the upper surface side of the semiconductor substrate 10. Each of the gate trench portion 40 and the dummy trench portion 30 is an example of a trench portion. In addition, the semiconductor apparatus 100 of the present example includes an emitter electrode 52 and the active-side gate runner 131 provided above the upper surface of the semiconductor substrate 10. The emitter electrode 52 and the active-side gate runner 131 are provided separately from each other.

An interlayer dielectric film is provided between the emitter electrode 52 and the active-side gate runner 131, and the upper surface of the semiconductor substrate 10, but is omitted in FIG. 13. In the interlayer dielectric film of the present example, a contact hole 54 is provided through the interlayer dielectric film. In FIG. 13, each contact hole 54 is hatched with oblique lines.

The emitter electrode 52 is provided above the gate trench portion 40, the dummy trench portion 30, the well region 11, the emitter region 12, the base region 14, and the contact region 15. The emitter electrode 52 is in contact with the emitter region 12, the contact region 15, and the base region 14 in the upper surface of the semiconductor substrate 10 through the contact hole 54. The emitter electrode 52 is connected to a dummy conductive portion in the dummy trench portion 30 through a contact hole provided in the interlayer dielectric film. The emitter electrode 52 may be connected to the dummy conductive portion of the dummy trench portion 30 at the edge of the dummy trench portion 30 in the Y axis direction.

The active-side gate runner 131 is connected to the gate trench portion 40 through a contact hole provided in the interlayer dielectric film. The active-side gate runner 131 may be connected to the gate conductive portion of the gate trench portion 40 at an edge portion 41 of the gate trench portion 40 in the Y axis direction. The active-side gate runner 131 is not connected to the dummy conductive portion in the dummy trench portion 30.

The emitter electrode 52 is formed of a material containing metal. FIG. 13 illustrates a range in which the emitter electrode 52 is provided. For example, at least a partial region of the emitter electrode 52 is formed of aluminum or an aluminum-silicon alloy, for example, a metal alloy such as AlSi or AlSiCu. The emitter electrode 52 may have a barrier metal formed of titanium, a titanium compound, or the like in a lower layer of a region formed of aluminum or the like. Further, in the contact hole, there may be provided a plug formed by embedding tungsten or the like so as to be in contact with the barrier metal and aluminum or the like.

The well region 11 is provided to overlap with the active-side gate runner 131. The well region 11 is also provided to extend with a predetermined width in a range not overlapping with the active-side gate runner 131. The well region 11 of the present example is provided away from the end of the contact hole 54 in the Y axis direction toward the active-side gate runner 131. The well region 11 is a region of a second conductivity type having a higher doping concentration than the base region 14. The base region 14 in the present example is a P− type, and the well region 11 is a P+ type.

Each of the transistor portion 70 and the diode portion 80 has a plurality of trench portions arranged in the arrangement direction. In the transistor portion 70 of the present example, one or more gate trench portions 40 and one or more dummy trench portions 30 are alternately provided along the arrangement direction. In the diode portion 80 of the present example, a plurality of dummy trench portions 30 are provided along the arrangement direction. The diode portion 80 of the present example is not provided with the gate trench portion 40.

The gate trench portion 40 of the present example may have two linear portions 39 (portions of the trenches which are straight along the extending direction) extending along the extending direction perpendicular to the arrangement direction and the edge portion 41 connecting the two linear portions 39. The extending direction in FIG. 13 is the Y axis direction.

At least a part of the edge portion 41 is preferably provided in a curved shape in a top view. By connecting the end portions of the two linear portions 39 in the Y axis direction to each other by the edge portion 41, an electric field strength at the end portion of the linear portion 39 can be reduced.

In the transistor portion 70, the dummy trench portion 30 is provided between the respective linear portions 39 of the gate trench portion 40. One dummy trench portion 30 or a plurality of dummy trench portions 30 may be provided between the respective linear portions 39. The dummy trench portion 30 may have a linear shape extending in the extending direction, and may have a linear portion 29 and an edge portion 31 similar to the gate trench portion 40. The semiconductor apparatus 100 illustrated in FIG. 13 includes both the linear dummy trench portion 30 not having the edge portion 31 and the dummy trench portion 30 having the edge portion 31.

The diffusion depth of the well region 11 may be deeper than the depths of the gate trench portion 40 and the dummy trench portion 30. The end portions of the gate trench portion 40 and the dummy trench portion 30 in the Y axis direction are provided in the well region 11 in a top view. That is, the bottom portion of each trench portion in the depth direction is covered with the well region 11 at the end portion of each trench portion in the Y axis direction. As a result, electric field strength at the bottom portion of each trench portion can be reduced.

A mesa portion is provided between the respective trench portions in the arrangement direction. The mesa portion refers to a region sandwiched between the trench portions inside the semiconductor substrate 10. As an example, the upper end of the mesa portion is the upper surface of the semiconductor substrate 10. The depth position of the lower end of the mesa portion is the same as the depth position of the lower end of the trench portion. The mesa portion of the present example is provided to extend in the extending direction (Y axis direction) along the trench in the upper surface of the semiconductor substrate 10. In the present example, the transistor portion 70 is provided with a mesa portion 60, and the diode portion 80 is provided with a mesa portion 61. In the case of simply referring to as a mesa portion in the present specification, the mesa portion refers to each of the mesa portion 60 and the mesa portion 61.

The base region 14 is provided in each mesa portion. In the base region 14 exposed to the upper surface of the semiconductor substrate 10 in the mesa portion, a region disposed closest to the active-side gate runner 131 is defined as a base region 14-e. In FIG. 13, the base region 14-e disposed at one end portion of each mesa portion in the extending direction is illustrated, but the base region 14-e is also disposed at the other end portion of each mesa portion. In each mesa portion, at least one of the emitter region 12 of the first conductivity type and the contact region 15 of the second conductivity type may be provided in a region sandwiched between the base regions 14-e in a top view. The emitter region 12 in the present example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed to the upper surface of the semiconductor substrate 10. The emitter region 12 is provided in contact with the gate trench portion 40. The mesa portion 60 in contact with the gate trench portion 40 may be provided with the contact region 15 exposed to the upper surface of the semiconductor substrate 10.

Each of the contact region 15 and the emitter region 12 in the mesa portion 60 is provided from one trench portion to the other trench portion in the X axis direction. As an example, the contact regions 15 and the emitter regions 12 of the mesa portion 60 are alternately disposed along the extending direction (Y axis direction) of the trench portion.

In another example, the contact region 15 and the emitter region 12 of the mesa portion 60 may be provided in a stripe shape along the extending direction (Y axis direction) of the trench portion. For example, the emitter region 12 is provided in a region in contact with the trench portion, and the contact region 15 is provided in a region sandwiched by the emitter region 12.

The emitter region 12 is not provided in the mesa portion 61 of the diode portion 80. The base region 14 and the contact region 15 may be provided in the upper surface of the mesa portion 61. The contact region 15 may be provided in contact with each of the base regions 14-e in a region sandwiched between the base regions 14-e in the upper surface of the mesa portion 61. The base region 14 may be provided in a region sandwiched between the contact regions 15 in the upper surface of the mesa portion 61. The base region 14 may be disposed in the entire region sandwiched by the contact region 15.

The contact hole 54 is provided above each mesa portion. The contact hole 54 is disposed in a region sandwiched between the base regions 14-e. The contact hole 54 of the present example is provided above each region of the contact region 15, the base region 14, and the emitter region 12. The contact hole 54 is not provided in a region corresponding to the base region 14-e and the well region 11. The contact hole 54 may be disposed at the center in the arrangement direction (X axis direction) of the mesa portion 60.

In the diode portion 80, an N+ type cathode region 82 is provided in a region adjacent to the lower surface of the semiconductor substrate 10. In the lower surface of the semiconductor substrate 10, a P+ type collector region 22 may be provided in a region where the cathode region 82 is not provided. The cathode region 82 and the collector region 22 are provided between the lower surface 23 of the semiconductor substrate 10 and the buffer region 20. In FIG. 13, the boundary between the cathode region 82 and the collector region 22 is indicated by a dotted line.

The cathode region 82 is disposed away from the well region 11 in the Y axis direction. As a result, a distance between the P type region (well region 11) having a relatively high doping concentration and formed up to a deep position and the cathode region 82 is secured, and the breakdown voltage can be improved. The end portion of the cathode region 82 in the Y axis direction of the present example is disposed farther from the well region 11 than the end portion of the contact hole 54 in the Y axis direction. In another example, the end portion of the cathode region 82 in the Y axis direction may be disposed between the well region 11 and the contact hole 54.

Figure 14:
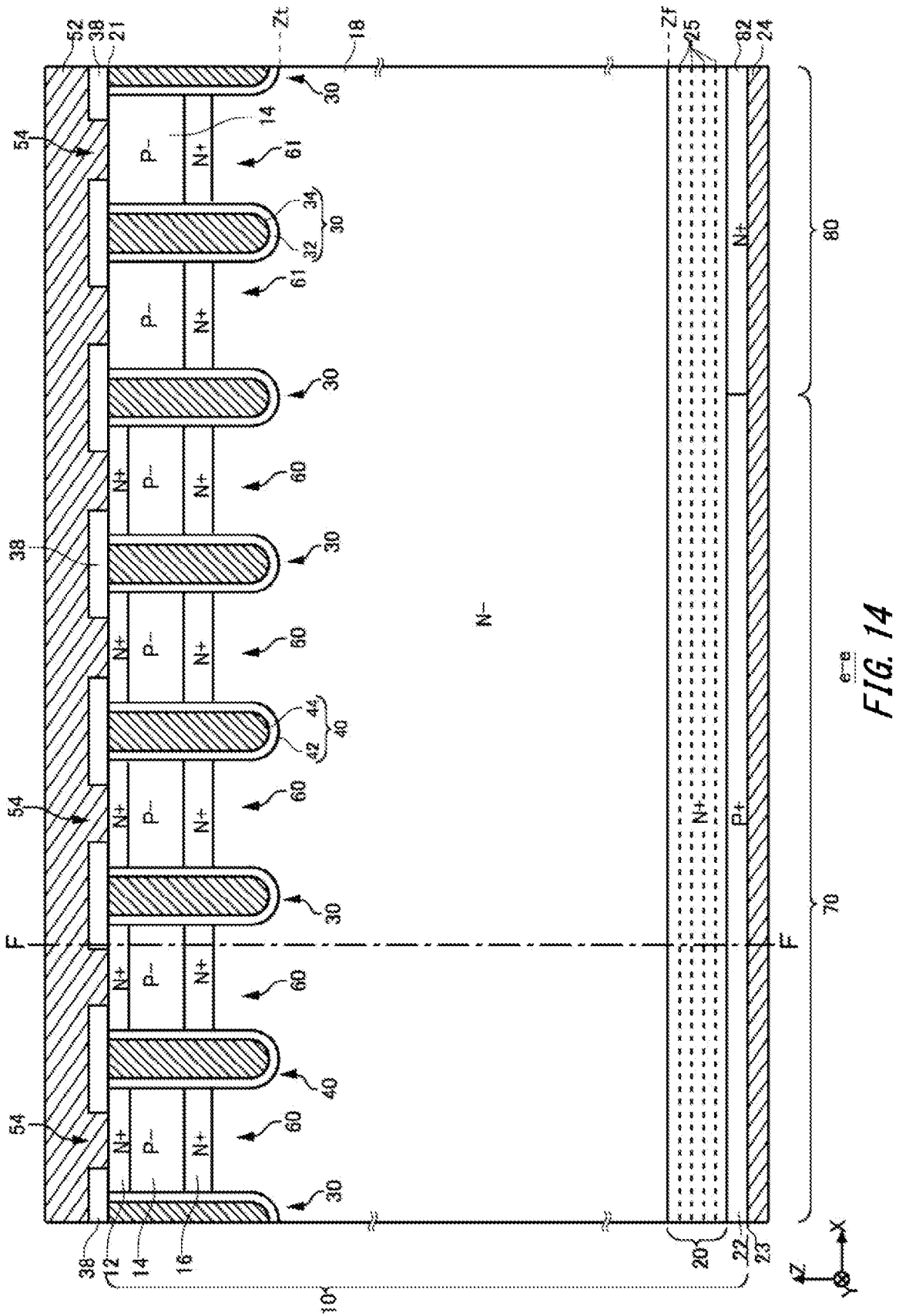
FIG. 14 is a diagram illustrating an example of an e-e cross section in FIG. 13.

FIG. 14 is a diagram illustrating an example of an e-e cross section in FIG. 13. The e-e cross section is an XZ plane passing through the emitter region 12 and the cathode region 82. The semiconductor apparatus 100 of the present example includes the semiconductor substrate 10, an interlayer dielectric film 38, the emitter electrode 52, and a collector electrode 24 in the cross section.

The interlayer dielectric film 38 is provided in the upper surface of the semiconductor substrate 10. The interlayer dielectric film 38 is a film including at least one of an insulating film such as silicate glass to which an impurity such as boron or phosphorus is added, a thermal oxide film, and other insulating films. The interlayer dielectric film 38 is provided with the contact hole 54 described in FIG. 13.

The emitter electrode 52 is provided above the interlayer dielectric film 38. The emitter electrode 52 is in contact with the upper surface 21 of the semiconductor substrate 10 through the contact hole 54 of the interlayer dielectric film 38. The collector electrode 24 is provided in the lower surface 23 of the semiconductor substrate 10. The emitter electrode 52 and the collector electrode 24 are made of a metal material such as aluminum. In the present specification, a direction (Z axis direction) connecting the emitter electrode 52 and the collector electrode 24 is referred to as a depth direction.

The semiconductor substrate 10 has an N type or N− type drift region 18. The drift region 18 is provided in each of the transistor portion 70 and the diode portion 80.

In the mesa portion 60 of the transistor portion 70, an N+ type emitter region 12 and a P− type base region 14 are provided in order from the upper surface 21 side of the semiconductor substrate 10. The drift region 18 is provided below the base region 14. The mesa portion 60 may be provided with an N+ type accumulation region 16. The accumulation region 16 is disposed between the base region 14 and the drift region 18.

The emitter region 12 is exposed to the upper surface 21 of the semiconductor substrate 10 and is provided in contact with the gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of the present example is provided in contact with the emitter region 12. The base region 14 may be in contact with the trench portions on both sides of the mesa portion 60.

The accumulation region 16 is provided below the base region 14. The accumulation region 16 is an N+ type region having a higher doping concentration than the drift region 18. By providing the high-concentration accumulation region 16 between the drift region 18 and the base region 14, the carrier implantation promotion effect (IE effect) can be enhanced, and the ON voltage can be reduced. The accumulation region 16 may be provided so as to cover the entire lower surface of the base region 14 in each mesa portion 60.

The mesa portion 61 of the diode portion 80 is provided with a P− type base region 14 in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ type buffer region 20 may be provided under the drift region 18. The doping concentration of the buffer region 20 is higher than the doping concentration of the drift region 18. The buffer region 20 has a concentration peak 25 having a higher doping concentration than the drift region 18. The doping concentration of the concentration peak 25 refers to the doping concentration at the local maximum of the concentration peak 25. As the doping concentration of the drift region 18, an average value of the doping concentration in a region where the doping concentration distribution is approximately flat may be used.

The buffer region 20 of the present example has three or more concentration peaks 25 in the depth direction (Z axis direction) of the semiconductor substrate 10. The concentration peak 25 of the buffer region 20 may be provided at the same depth position as the concentration peak of hydrogen (proton) or phosphorus, for example. The buffer region 20 may serve as a field stop layer that prevents a depletion layer extending from the lower end of the base region 14 from reaching the P+ type collector region 22 and the N+ type cathode region 82. In the present specification, the depth position of the upper end of the buffer region 20 is defined as Zf. The depth position Zf may be a position where the doping concentration is higher than the doping concentration of the drift region 18.

In the transistor portion 70, the P+ type collector region 22 is provided below the buffer region 20. The acceptor concentration of the collector region 22 is higher than the acceptor concentration of the base region 14. The collector region 22 may contain the same acceptor as the base region 14, and may contain a different acceptor. The acceptor of the collector region 22 is, for example, boron.

In the diode portion 80, the N+ type cathode region 82 is provided below the buffer region 20. The donor concentration of the cathode region 82 is higher than the donor concentration of the drift region 18. The donor of the cathode region 82 is, for example, hydrogen or phosphorus. Elements to be donors and acceptors in each region are not limited to the examples described above. The collector region 22 and the cathode region 82 are exposed to the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion penetrates the base region 14 from the upper surface 21 of the semiconductor substrate 10 to reach the drift region 18. In the region where at least one of the emitter region 12, the contact region 15, and the accumulation region 16 is provided, each trench portion also penetrates these doping regions and reaches the drift region 18. The trench portion penetrating the doping region is not limited to those manufactured in the order of forming the doping region and then forming the trench portion. A case where a doping region is formed between the trench portions after the trench portion is formed is also included in a case where the trench portion penetrates the doping region.

As described above, the transistor portion 70 is provided with the gate trench portion 40 and the dummy trench portion 30. The diode portion 80 is provided with the dummy trench portion 30 and is not provided with the gate trench portion 40. In the present example, the boundary between the diode portion 80 and the transistor portion 70 in the X axis direction is the boundary between the cathode region 82 and the collector region 22.

The gate trench portion 40 includes a gate trench, a gate insulating film 42, and a gate conductive portion 44 provided in the upper surface 21 of the semiconductor substrate 10. The gate insulating film 42 is provided to cover the inner wall of the gate trench. The gate insulating film 42 may be formed by oxidizing or nitriding the semiconductor of the inner wall of the gate trench. The gate conductive portion 44 is provided on the inner side of the gate insulating film 42 inside the gate trench. That is, the gate insulating film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered with the interlayer dielectric film 38 in the upper surface 21 of the semiconductor substrate 10. The gate conductive portion 44 is electrically connected to the gate runner. If a predetermined gate voltage is applied to the gate conductive portion 44, a channel by an inversion layer of electrons is formed in a surface layer of the interface in contact with the gate trench portion 40 in the base region 14.

The dummy trench portion 30 may have the same structure as the gate trench portion 40 in the cross section. The dummy trench portion 30 includes a dummy trench provided in the upper surface 21 of the semiconductor substrate 10, a dummy insulating film 32, and a dummy conductive portion 34. The dummy conductive portion 34 is electrically connected to the emitter electrode 52. The dummy insulating film 32 is provided to cover the inner wall of the dummy trench. The dummy conductive portion 34 is provided inside the dummy trench and is provided on the inner side of the dummy insulating film 32. The dummy insulating film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of the present example are covered with the interlayer dielectric film 38 in the upper surface 21 of the semiconductor substrate 10. Note that the bottom portions of the dummy trench portion 30 and the gate trench portion 40 may have a curved surface shape protruding downward (a curved shape in a cross section). In the present specification, the depth position of the lower end of the gate trench portion 40 is defined as Zt.

The drift region 18 may have the same donor concentration as the donor concentration of the linear portion 214 or the hydrogen increasing portion 180 described in FIG. 1 to FIG. 11B. That is, the drift region 18 has a donor concentration Dd determined mainly by the bulk donor concentration D0 and the hydrogen donor (VOH defect) concentration. A dopant is locally implanted in a region other than the drift region 18. Therefore, the doping concentration in these regions is different from the donor concentration described in FIG. 1 to FIG. 11B.

Figure 15:
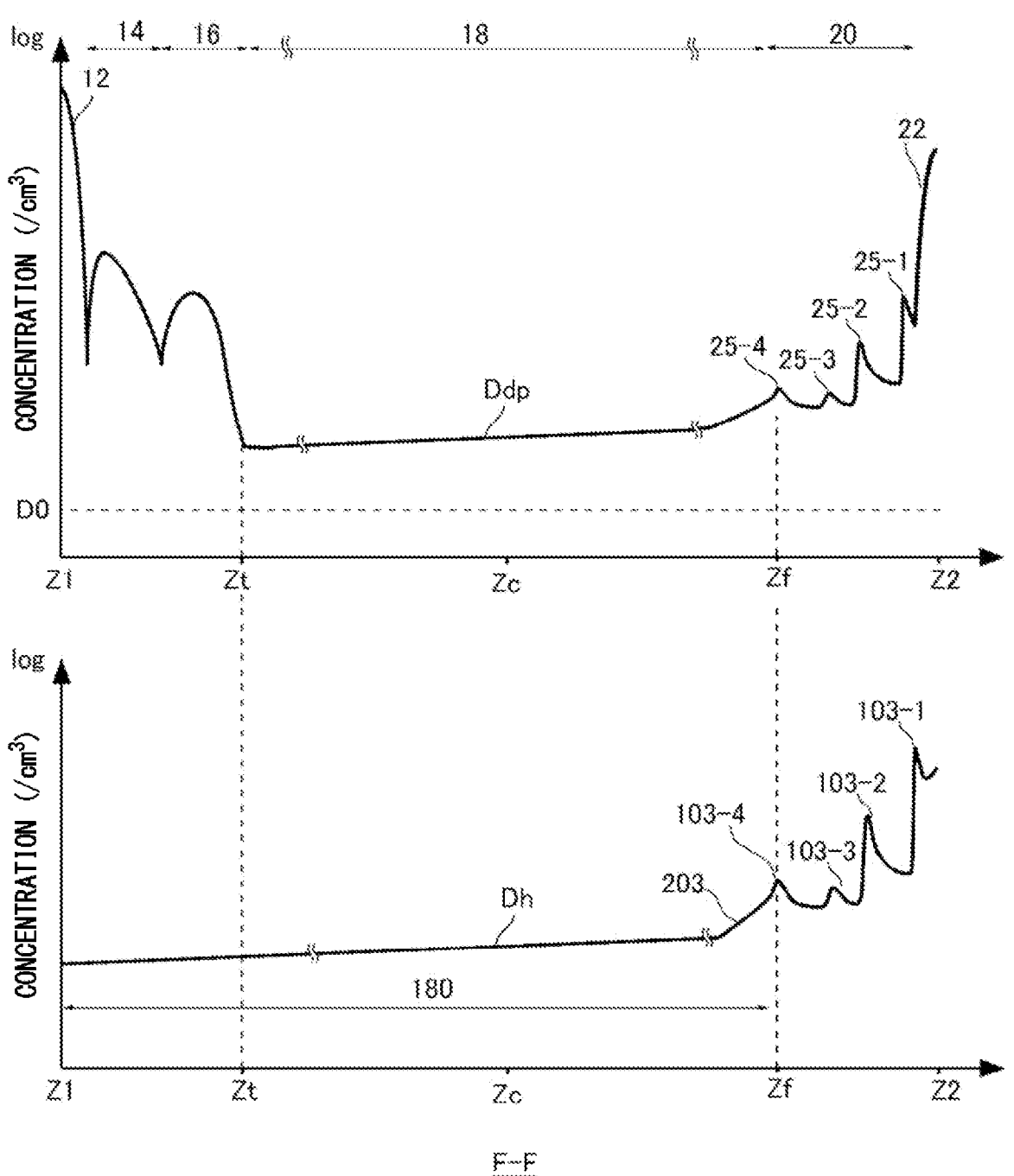
FIG. 15 is a diagram illustrating a distribution example of a doping concentration Ddp and a hydrogen chemical concentration Dh taken along line F-F in FIG. 14.

FIG. 15 is a diagram illustrating a distribution example of the doping concentration Ddp and the hydrogen chemical concentration Dh taken along line F-F in FIG. 14. The semiconductor apparatus 100 of the present example does not include a lifetime adjustment portion. The doping concentration Ddp may have a shape in which a local concentration peak in each region is superimposed on the distribution of the donor concentration Dd of any aspect described in FIG. 1 to FIG. 11B.

The emitter region 12 and the cathode region 82 contain an N-type dopant such as phosphorus. The collector region 22 and the base region 14 contain a P-type dopant such as boron. The accumulation region 16 contains an N-type dopant such as phosphorus or hydrogen. The doping concentration of each region has a doping concentration peak corresponding to each dopant concentration peak.

The buffer region 20 of the present example has a plurality of doping concentration peaks 25-1, 25-2, 25-3, and 25-4 in the distribution of the doping concentration Dp. In the present example, each doping concentration peak 25 is formed by locally implanting hydrogen ions. In another example, any doping concentration peak 25 may be formed by implanting an N-type dopant such as phosphorus.

The distribution of the hydrogen chemical concentration Dh in the present example has a plurality of local hydrogen concentration peaks 103 in the buffer region 20. The half-value width of the hydrogen concentration peak 103 is $\frac{1}{10}$ or less of the thickness of the semiconductor substrate 10 in the depth direction. The distribution of the hydrogen chemical concentration Dh is flat or monotonically increases toward the lower surface 23 except for a region where the local hydrogen concentration peak 103 is provided. In the present example, the hydrogen increasing portion 180 is provided from the upper surface 21 of the semiconductor substrate 10 to a depth position Zf of the upper end of the buffer region 20. The hydrogen increasing portion 180 may be provided up to a local maximum position of a hydrogen concentration peak 103-4 closest to the upper surface 21 among the plurality of hydrogen concentration peaks 103. The depth position Zf of the upper end of the buffer region 20 may be a position of the local maximum of the hydrogen concentration peak 103-4 closest to the upper surface 21.

Among the plurality of hydrogen concentration peaks 103, the hydrogen concentration peak 103-4 closest to the upper surface 21 may be the first hydrogen concentration peak 201 described in FIG. 1 to FIG. 11B. That is, hydrogen ions may be implanted into the position of the hydrogen concentration peak 103 from the upper surface 21. Hydrogen ions may be implanted into the position of the other hydrogen concentration peak 103 from the lower surface 23. In the present example, the hydrogen increasing portion 180 is provided from a depth position Zt of the lower end of the gate trench portion 40 to the upper tail 203 of the hydrogen concentration peak 103-4. The hydrogen increasing portion 180 may include the upper tail 203.

In another example, any two hydrogen concentration peaks 103 may be the first hydrogen concentration peak 201 and the second hydrogen concentration peak 206 described in FIG. 8A or FIG. 9A. Two hydrogen concentration peaks 103 disposed adjacent to each other in the depth direction may be the first hydrogen concentration peak 201 and the second hydrogen concentration peak 206. Among the plurality of hydrogen concentration peaks 103, the hydrogen concentration peak 103-4 closest to the upper surface 21 may be the second hydrogen concentration peak 206, and a hydrogen concentration peak 103-3 next closest to the upper surface 21 may be the first hydrogen concentration peak 201. Hydrogen ions may be implanted into the position of the second hydrogen concentration peak 206 from the lower surface 23.

Figure 16:
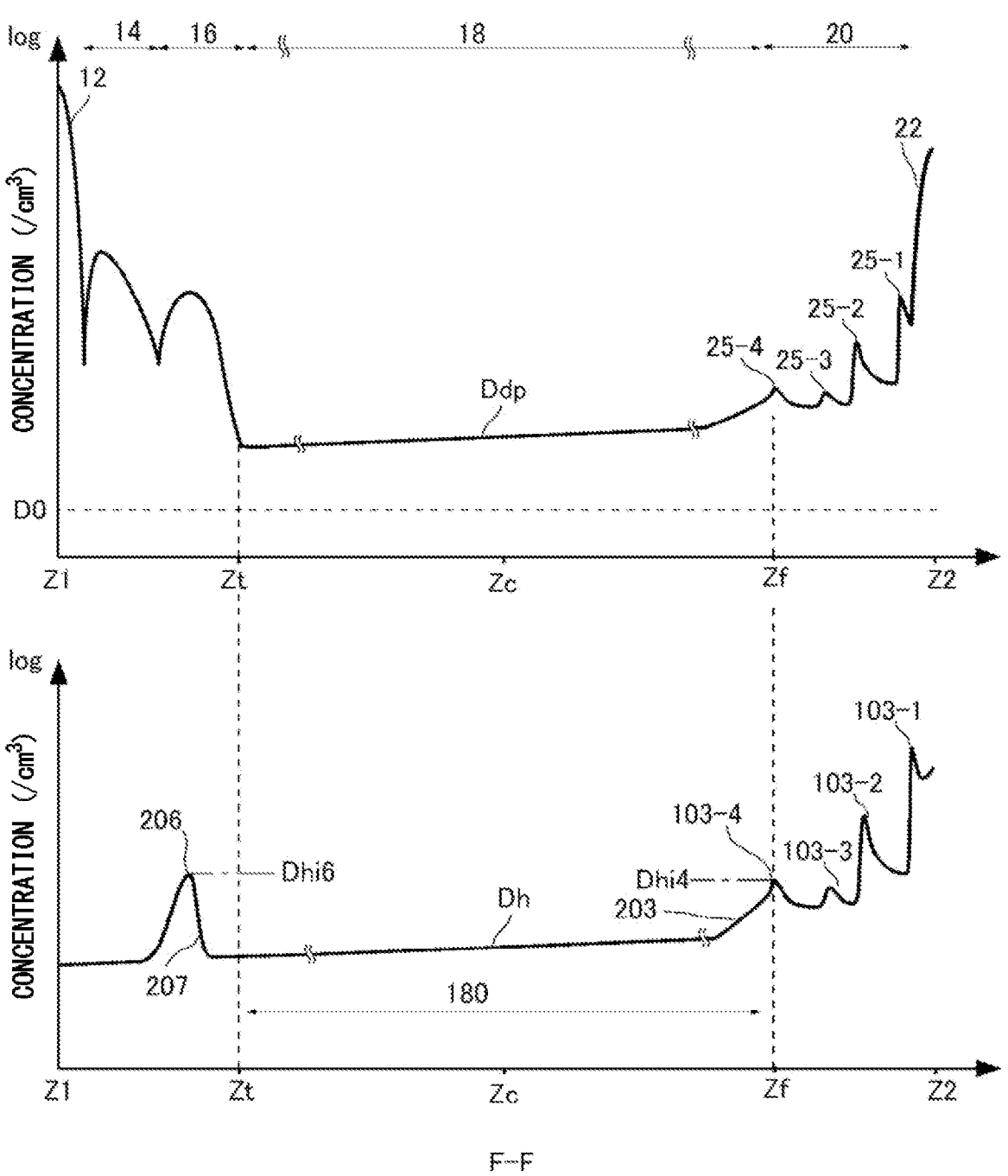
FIG. 16 is a diagram illustrating another distribution example of the doping concentration Ddp and the hydrogen chemical concentration Dh taken along line F-F in FIG. 14.

FIG. 16 is a diagram illustrating another distribution example of the doping concentration Ddp and the hydrogen chemical concentration Dh taken along line F-F in FIG. 14. The accumulation region 16 of the present example is formed by implanting hydrogen ions. That is, the donor of the accumulation region 16 is a hydrogen donor. Other structures may be the same as in the example of FIG. 15. In the example of FIG. 16, the hydrogen concentration peak 103-4 corresponds to the first hydrogen concentration peak 201.

The distribution of the hydrogen chemical concentration Dh in the present example has the second hydrogen concentration peak 206 at the depth position of the accumulation region 16. Hydrogen ions may be implanted into the position of the second hydrogen concentration peak 206 from the upper surface 21. By forming the accumulation region 16 with hydrogen donors, hydrogen can be diffused from the accumulation region 16 toward the lower surface 23. As a result, the hydrogen increasing portion 180 can be easily formed. The hydrogen chemical concentration Dhi6 of the second hydrogen concentration peak 206 may be larger or smaller than the hydrogen chemical concentration Dhi4 of the hydrogen concentration peak 103-4.

At least a part of the hydrogen increasing portion 180 is disposed between the depth position Zt of the lower end of the gate trench portion 40 and the lower surface 23 of the semiconductor substrate 10. When the buffer region 20 has the hydrogen concentration peak 103, the hydrogen increasing portion 180 is disposed between the depth position Zt of the lower end of the gate trench portion 40 and the depth position Zf of the upper end of the buffer region 20. In the example of FIG. 16, the hydrogen increasing portion 180 is provided from the depth position Zt of the lower end of the gate trench portion 40 to the depth position Zf of the upper end of the buffer region 20. The hydrogen increasing portion 180 may be provided from the depth position of the lower end of the accumulation region 16 to the depth position Zf of the upper end of the buffer region 20. The depth position of the lower end of the accumulation region 16 is a position where the hydrogen chemical concentration Dh starts to rise from the lower tail 207 toward the lower surface 23.

Figure 17:
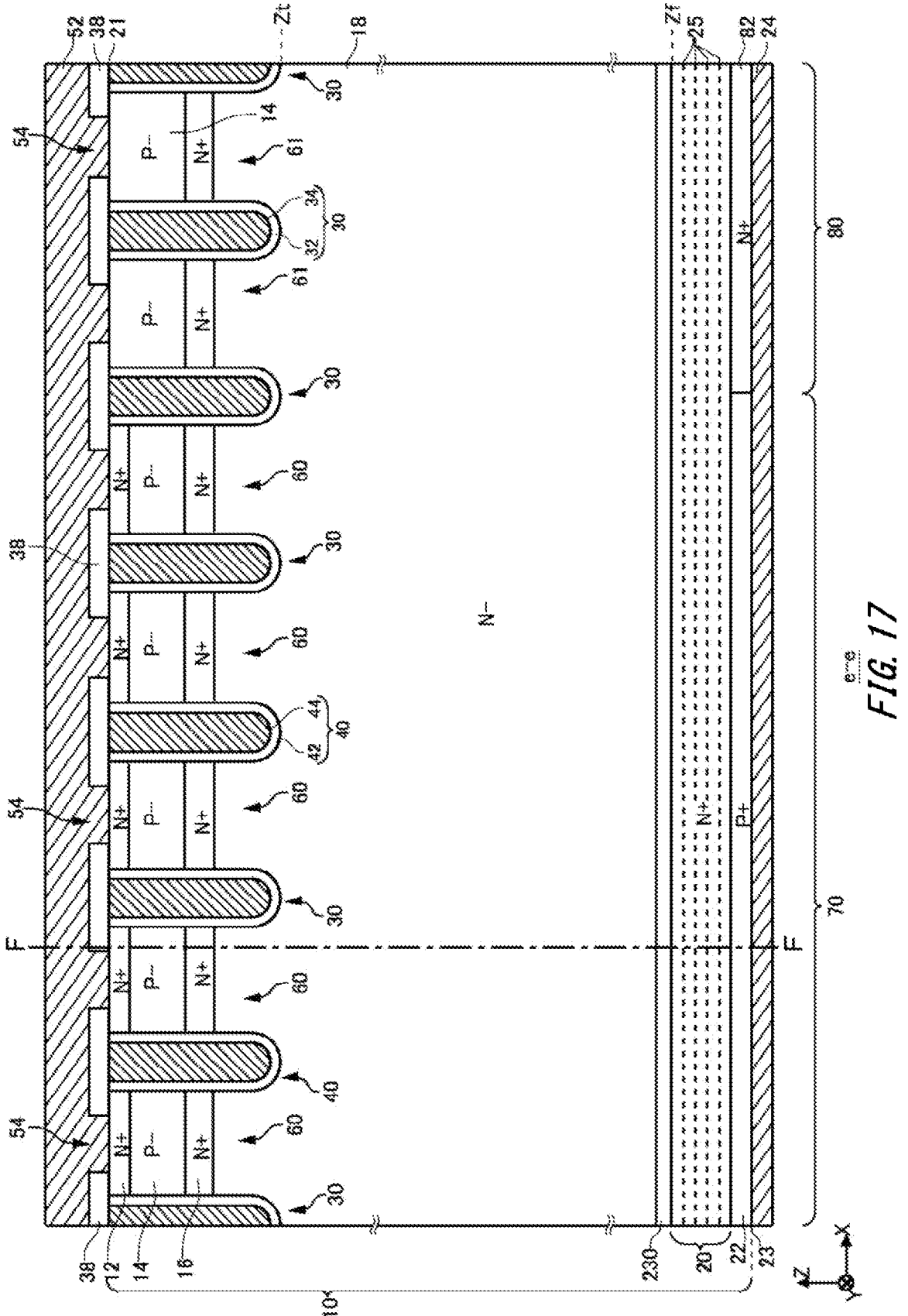
FIG. 17 is a diagram illustrating another example of the e-e cross section in FIG. 13.

FIG. 17 is a diagram illustrating another example of the e-e cross section in FIG. 13. The semiconductor apparatus 100 of the present example includes the lifetime adjustment portion 230 on the upper side of the buffer region 20. Other structures are the same as the example of FIG. 13.

The lifetime adjustment portion 230 may have the structure described in FIG. 11A. The lifetime adjustment portion 230 of the present example may be disposed in contact with the hydrogen concentration peak 103-4 (see FIG. 15 and the like) disposed on the most upper surface 21 side in the buffer region 20. The hydrogen concentration peak 103-4 may be the second hydrogen concentration peak 206 described in FIG. 11A.

Figure 18:
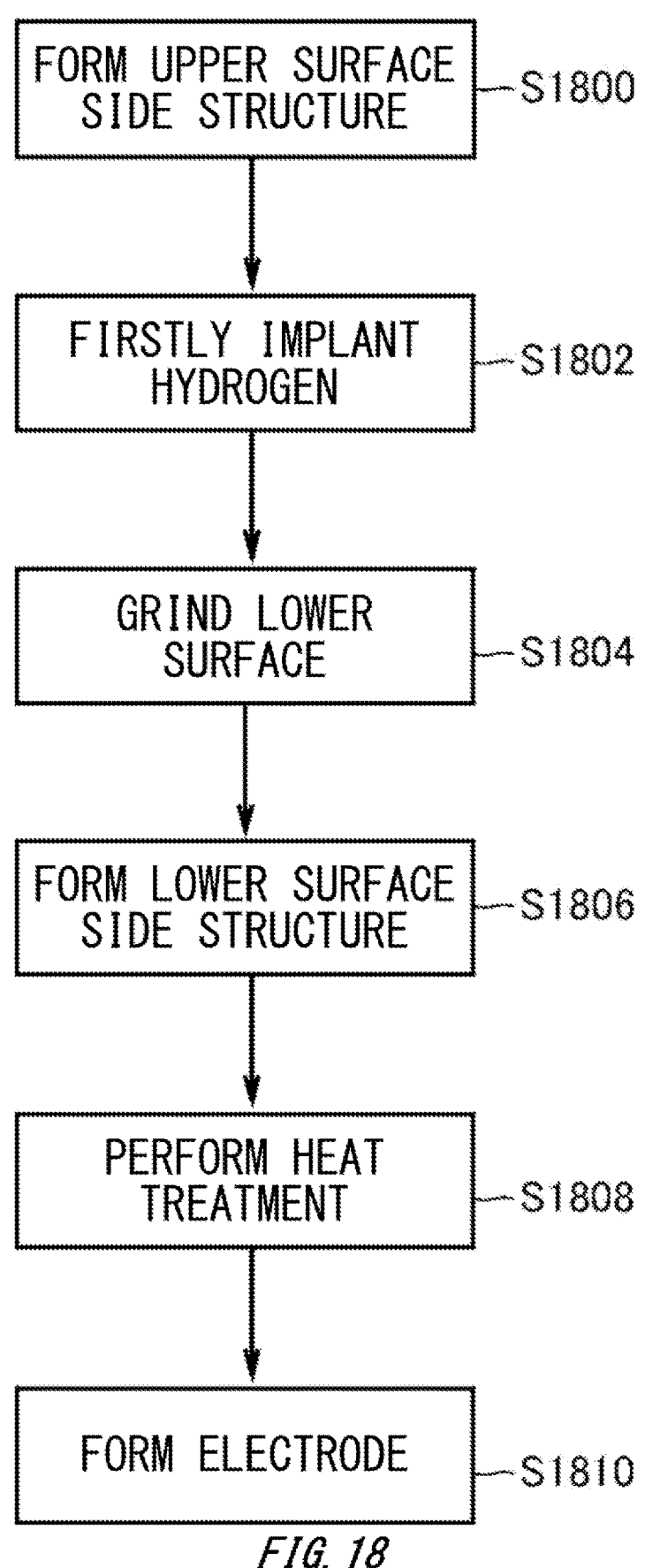
FIG. 18 is a diagram illustrating an example of a manufacturing method of the semiconductor apparatus 100.

FIG. 18 is a diagram illustrating an example of a manufacturing method of the semiconductor apparatus 100. The manufacturing method of the present example includes an upper surface side structure forming step S1800, a first hydrogen implanting step S1802, a grinding step S1804, a lower surface side structure forming step S1806, a heat treatment step S1808, and an electrode forming step S1810.

In the upper surface side structure forming step S1800, a structure on the upper surface 21 side of the semiconductor substrate 10 in the structure of the semiconductor apparatus 100 is formed. The semiconductor substrate 10 in the upper surface side structure forming step S1800 is a substrate before grinding having the lower surface 19 (see FIG. 1). The structure on the upper surface 21 side includes, for example, the base region 14, the emitter region 12, the accumulation region 16, the gate trench portion 40, the dummy trench portion 30, the well region 11, the emitter electrode 52, the interlayer dielectric film 38, the gate runner, and the like.

Next, in the first hydrogen implanting step S1802, hydrogen ions are implanted into a predetermined first implantation position Zi1 inside the semiconductor substrate 10 from the upper surface 21 of the semiconductor substrate 10. The semiconductor substrate 10 in the first hydrogen implanting step S1802 is a substrate before grinding having the lower surface 19. The first implantation position Zi1 is disposed below the center Zc in the depth direction of the semiconductor substrate after the grinding step S1804. As described in FIG. 2 and the like, the first implantation position Zi1 may be disposed in the vicinity of the lower surface 23 after grinding. The first implantation position Zi1 may be any position described in FIG. 1 to FIG. 17.

As an example, the dose amount of hydrogen ions in the first hydrogen implanting step S1802 ranges from $1 \times 10^{13}$ ions/cm$^2$ to $1 \times 10^{14}$ ions/cm$^2$. A lattice defect is formed in the pass-through region from the upper surface 21 to the first implantation position Zi1.

Next, in the grinding step S1804, the lower surface 19 of the semiconductor substrate 10 is ground to remove a part of the region where hydrogen exists. In the grinding step S1804, the position of the lower surface 23 after grinding may be the same as any example described in FIG. 1 to FIG. 17. For example, in the grinding step S1804, a region from the lower surface 19 to a position beyond the first implantation position Zi1 is removed.

Next, in the lower surface side structure forming step S1806, a structure on the lower surface 23 side of the semiconductor substrate 10 is formed. The structure on the lower surface 23 side includes, for example, the collector region 22, the cathode region 82, the buffer region 20, and the like. In the process after the first hydrogen implanting step S1802, it is preferable that there is no process of heating the entire semiconductor substrate 10 to 500° C. or higher so that the implanted hydrogen is not released to the outside of the semiconductor substrate 10. When the collector region 22, the cathode region 82, and the like are formed in the lower surface side structure forming step S1806, local annealing may be performed by laser annealing. An oxide film such as the gate insulating film 42 illustrated in FIG. 17 may be formed by thermal oxidation at a high temperature of about 1000° C. Therefore, the first hydrogen implanting step S1802 is preferably performed after the thermal oxidation process.

Next, the semiconductor substrate 10 is heat-treated in the heat treatment step S1808 to form hydrogen donors (VOH defects). In the heat treatment step S1808, the semiconductor substrate 10 may be put into a heat treatment furnace to heat the entire semiconductor substrate 10. In the heat treatment step S1808, the heat treatment is performed under the condition that hydrogen is diffused and the formation of hydrogen donors can be promoted. In the heat treatment step S1808, the heat treatment may be performed at a temperature of 350° C. or more and 380° C. or less for a period of 3 hours or more and 10 hours or less. By the heat treatment step S1808, a hydrogen donor can be formed in the pass-through region of hydrogen ions to adjust the donor concentration and the specific resistance in the pass-through region. The concentration of the hydrogen donor to be formed can be accurately controlled by the dose amount of hydrogen ions in the first hydrogen implanting step S1802. Therefore, the donor concentration and the specific resistance in the pass-through region can be accurately controlled. Therefore, variations in characteristics of the semiconductor apparatus 100, particularly in breakdown voltage, can be suppressed.

Next, the collector electrode 24 is formed in the electrode forming step S1810. The processes from S1800 to S1810 may be performed using a semiconductor substrate in a wafer state. In this case, after S1810, the semiconductor apparatus 100 in a chip state may be manufactured by dividing the wafer into pieces.

Figure 19:
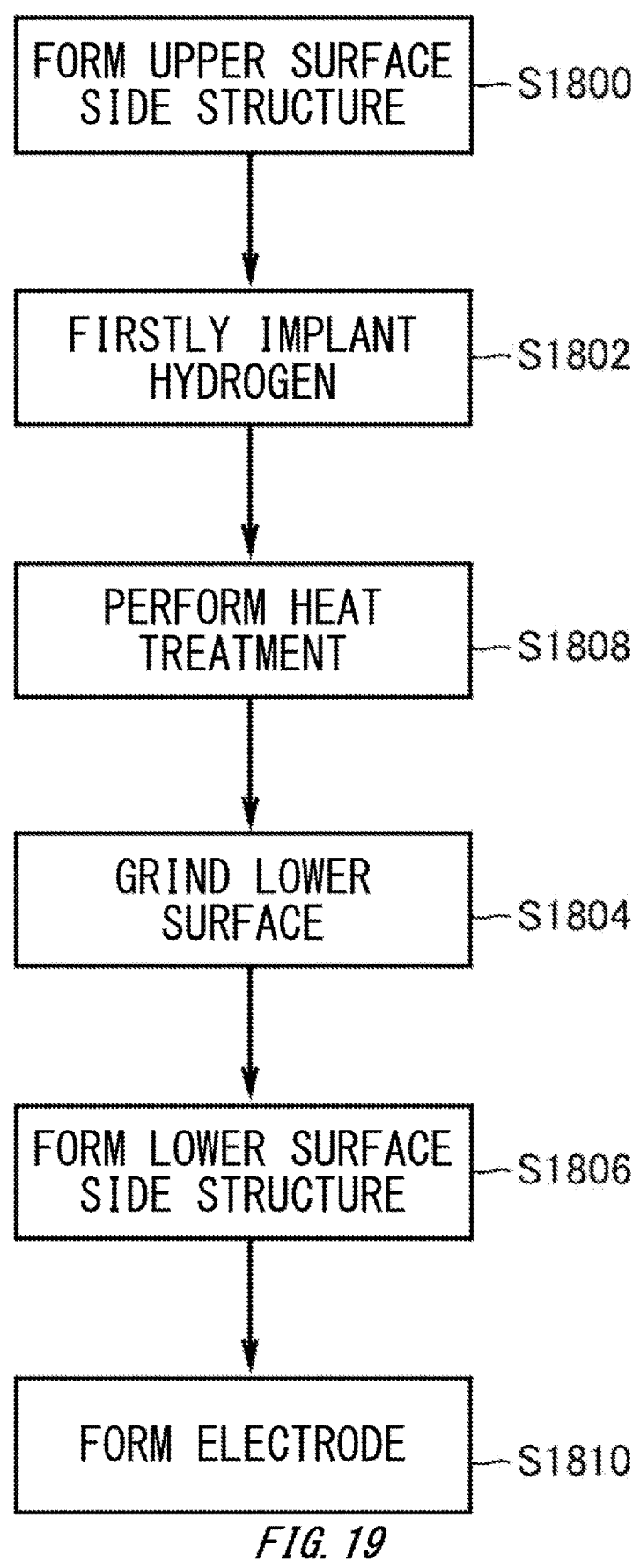
FIG. 19 is a diagram illustrating another example of the manufacturing method of the semiconductor apparatus 100.

FIG. 19 is a diagram illustrating another example of the manufacturing method of the semiconductor apparatus 100. In the present example, the timing of performing the heat treatment step S1808 is different from that in the example of FIG. 18. Other processes are the same as in the example of FIG. 18.

In the present example, after the first hydrogen implanting step S1802 and before the grinding step S1804, the heat treatment step S1808 is performed. That is, a hydrogen donor is formed before the grinding step S1804. The heat treatment conditions in the heat treatment step S1808 may be the same as those in the example of FIG. 18.

After the heat treatment step S1808, the grinding step S1804, the lower surface side structure forming step S1806, and the electrode forming step S1810 are performed. The semiconductor apparatus 100 can also be manufactured by such a process.

Figure 20:
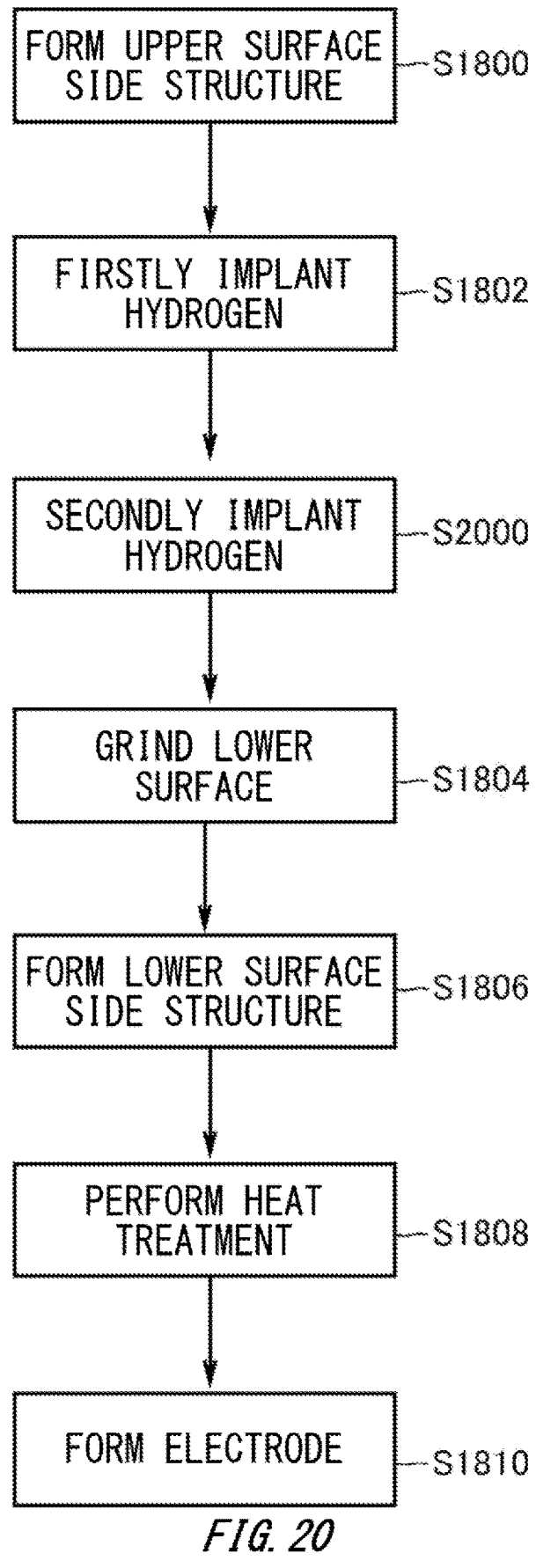
FIG. 20 is a diagram illustrating another example of the manufacturing method of the semiconductor apparatus 100.

FIG. 20 is a diagram illustrating another example of the manufacturing method of the semiconductor apparatus 100. The manufacturing method of the present example further includes a second hydrogen implanting step S2000 after the upper surface side structure forming step S1800 and before the heat treatment S1808 in the process illustrated in FIG. 18. Other processes are the same as in the example of FIG. 18.

In the second hydrogen implanting step S2000, hydrogen ions are implanted into a predetermined second implantation position Zi2 inside the semiconductor substrate 10 from the upper surface 21 or the lower surface 23 of the semiconductor substrate 10. The second implantation position Zi2 may be any position described in FIG. 1 to FIG. 17. As in the example of FIG. 9A, hydrogen may be implanted at the second implantation position Zi2 so that the first hydrogen concentration peak 201 of hydrogen implanted in the first hydrogen implanting step S1802 overlaps with the second hydrogen concentration peak 206 of hydrogen implanted in the second hydrogen implanting step S2000.

The second hydrogen implanting step S2000 may be performed before or after the grinding step S1804. The second hydrogen implanting step S2000 may be performed before or after the first hydrogen implanting step S1802. In the example of FIG. 20, the second hydrogen implanting step S2000 is performed between the first hydrogen implanting step S1802 and the grinding step S1804.

The range of hydrogen ions in the second hydrogen implanting step S2000 may be shorter than the range of hydrogen ions in the first hydrogen implanting step S1802. The acceleration energy of hydrogen ions in the second hydrogen implanting step S2000 may be lower than the acceleration energy of hydrogen ions in the first hydrogen implanting step S1802. As a result, the density of lattice defects formed in the vicinity of the second implantation position Zi2 can be reduced.

As an example, the dose amount of hydrogen ions in the second hydrogen implanting step S2000 ranges from $1\times10^{13}$ ions/cm$^2$ to $1\times10^{15}$ ions/cm$^2$. The dose amount of hydrogen ions in the second hydrogen implanting step S2000 may be larger than the dose amount of hydrogen ions in the first hydrogen implanting step S1802. This makes it possible to supply a large amount of hydrogen for forming a hydrogen donor.

In the example of FIG. 20, the grinding step S1804 is performed after the second hydrogen implanting step S2000. In the grinding step S1804, the semiconductor substrate 10 may be ground to any position described in FIG. 1 to FIG. 17. In the grinding step S1804, the region including the second implantation position Zi2 may be removed. The second implantation position Zi2 may be disposed in a region that is not ground in the grinding step S1804. In addition, in the grinding step S1804, the region including the first implantation position Zi1 may be removed. In addition, the first implantation position Zi1 may be disposed in a region that is not ground in the grinding step S1804. After the grinding step S1804, the lower surface side structure forming step S1806, the heat treatment step S1808, and the electrode forming step S1810 are performed. Thus, the semiconductor apparatus 100 can be manufactured.

Figure 21:
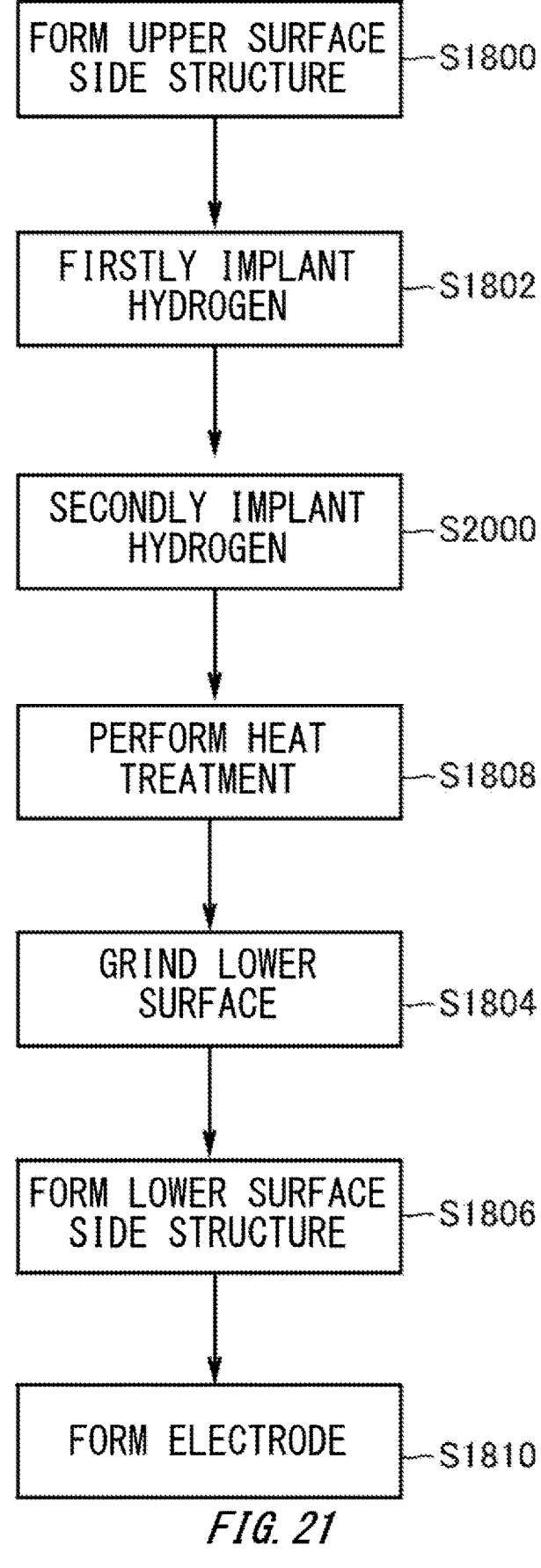
FIG. 21 is a diagram illustrating another example of the manufacturing method of the semiconductor apparatus 100.

FIG. 21 is a diagram illustrating another example of the manufacturing method of the semiconductor apparatus 100. In the present example, the timing of performing the heat treatment step S1808 is different from that in the example of FIG. 20. Other processes are the same as in the example of FIG. 20.

In the present example, the heat treatment step S1808 is performed after the first hydrogen implanting step S1802 and the second hydrogen implanting step S2000 and before the grinding step S1804. That is, a hydrogen donor is formed before the grinding step S1804. The heat treatment conditions in the heat treatment step S1808 may be the same as those in the example of FIG. 18.

After the heat treatment step S1808, the grinding step S1804, the lower surface side structure forming step S1806, and the electrode forming step S1810 are performed. The semiconductor apparatus 100 can also be manufactured by such a process.

The order of the processes described in FIG. 18 to FIG. 21 can be changed as appropriate. For example, the grinding step S1804 may be performed between the first hydrogen implanting step S1802 and the second hydrogen implanting step S2000. When hydrogen ions are implanted from the lower surface side in the second hydrogen implanting step S2000, the acceleration energy of hydrogen ions in the second hydrogen implanting step S2000 can be lowered by performing the grinding step S1804 first. As a result, damage to the semiconductor substrate 10 can be suppressed.

Further, after the lower surface structure forming step S1806, each hydrogen implanting step and the heat treatment step S1808 may be performed. The heat treatment step S1808 may be performed in the middle of the lower surface structure forming step S1806. Each hydrogen implantation step may be included in the upper surface side structure forming step S1800 or the lower surface side structure forming step S1806. As described with reference to FIG. 15 and the like, each hydrogen implanting step may be performed in the process of forming the buffer region 20. As described with reference to FIG. 16 and the like, the second hydrogen implanting step S2000 may be performed in the process of forming accumulation region 16.

Figure 22:
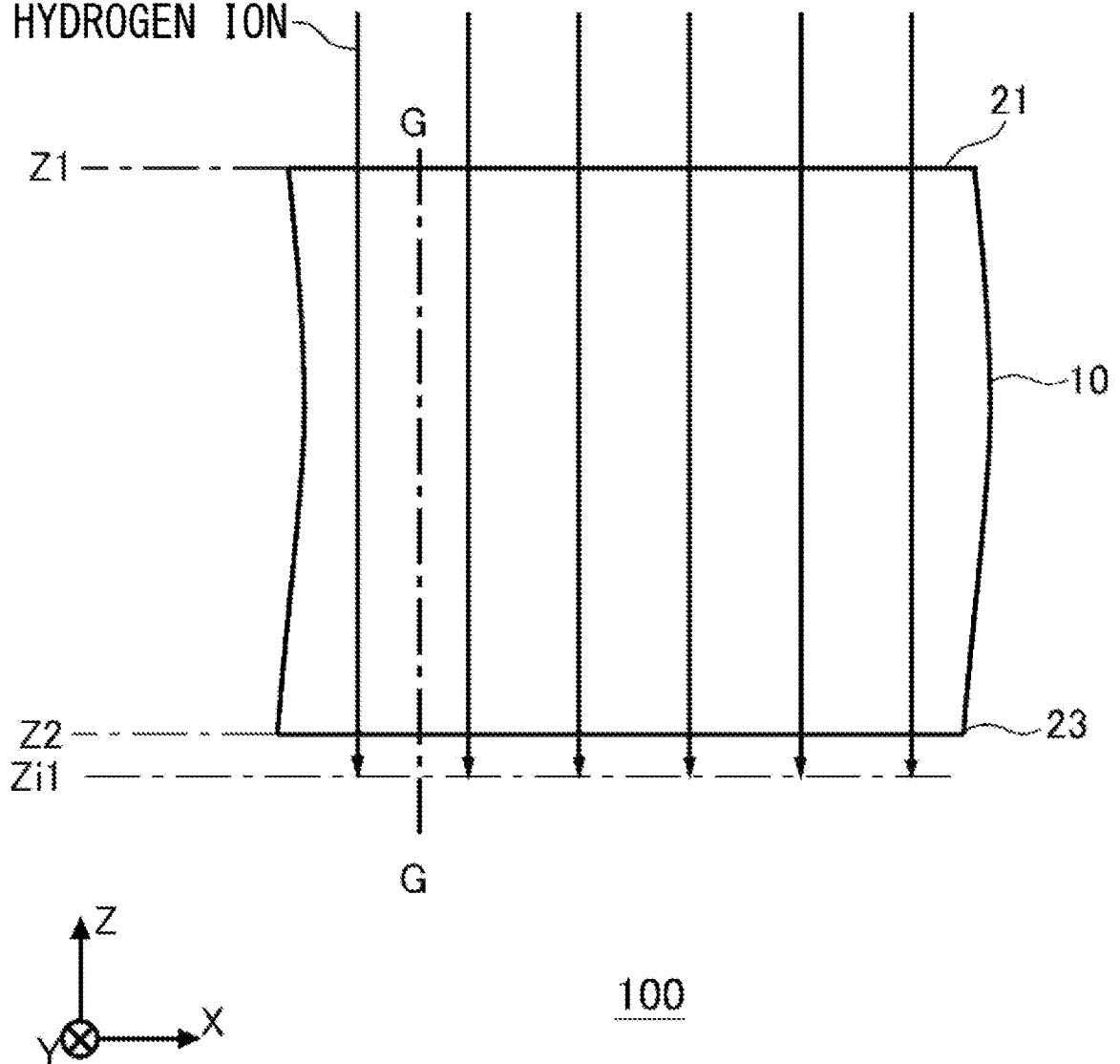
FIG. 22 is a sectional view illustrating another example of the semiconductor apparatus 100.

FIG. 22 is a sectional view illustrating another example of the semiconductor apparatus 100. The semiconductor apparatus 100 of the present example is different from the semiconductor apparatus 100 described with reference to FIG. 1 to FIG. 21 in that hydrogen ions are implanted into the first implantation position Zi1 after the semiconductor substrate 10 is ground. In other respects, the semiconductor apparatus 100 of the present example is the same as any of the semiconductor apparatuses 100 described in FIG. 1 to FIG. 21. The structure of the semiconductor apparatus 100 of the present example may be the same as the semiconductor apparatuses 100 described in FIG. 1 to FIG. 21.

The semiconductor substrate 10 after grinding has the upper surface 21 and the lower surface 23. In the present example, hydrogen ions are implanted into the first implantation position Zi1 from the upper surface 21. The first implantation position Zi1 is a position outside the semiconductor substrate 10 and a position below the lower surface 23 of the semiconductor substrate 10. The first implantation position Zi1 may be a position in a region where the semiconductor substrate is ground and removed. The distance between the depth position Z2 of the lower surface 23 and the first implantation position Zi1 may be similar to or different from any of the examples described in FIG. 1 to FIG. 21. The acceleration energy in the case of implanting hydrogen ions into the first implantation position Zi1 may be similar to or different from any of the examples described in FIG. 1 to FIG. 21. The donor concentration of the semiconductor substrate 10 can be controlled with high accuracy.

Figure 23:
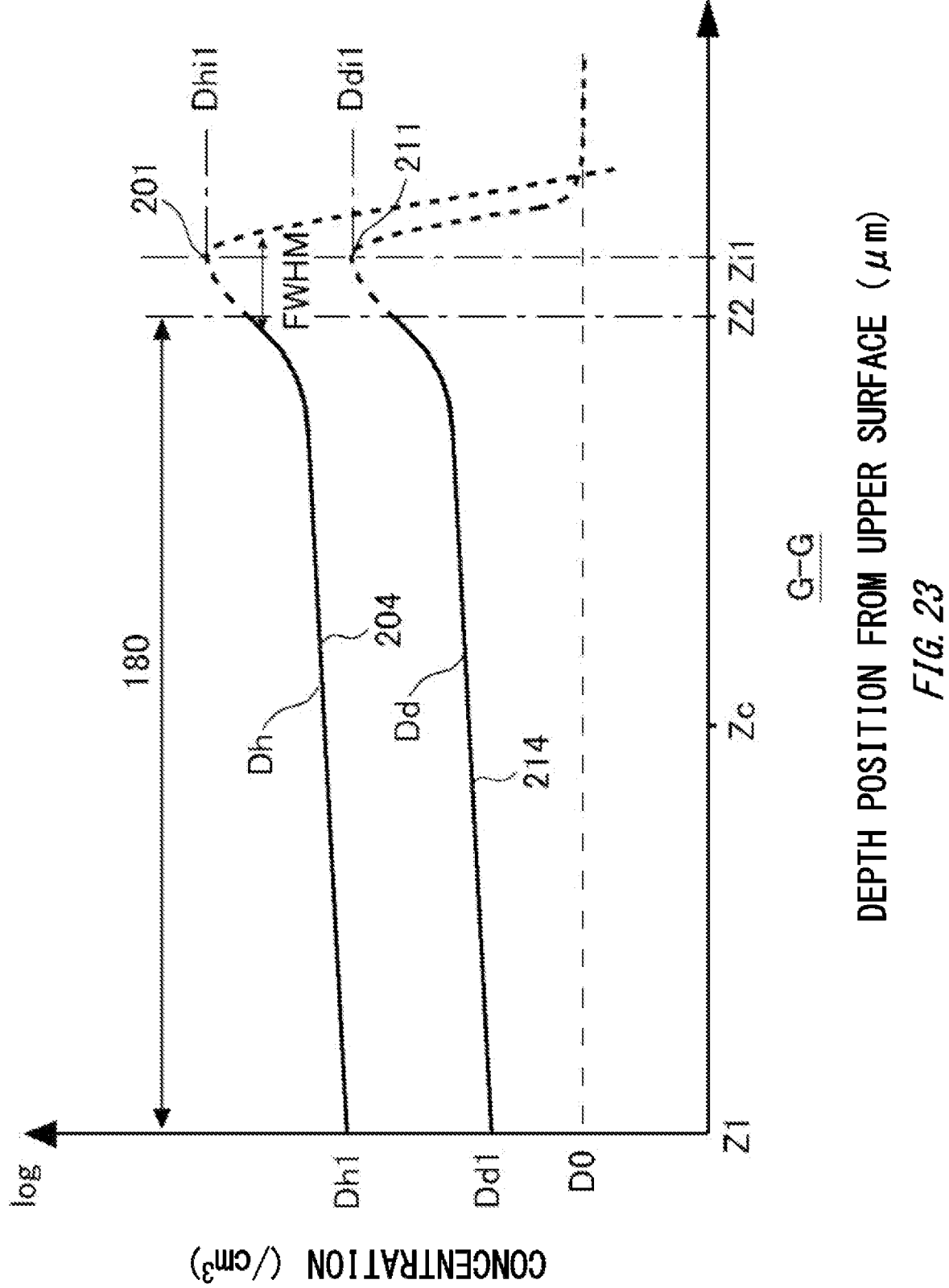
FIG. 23 illustrates an example of a distribution of a hydrogen chemical concentration Dh, a distribution of a donor concentration Dd, and a distribution of a bulk donor concentration D0 in a depth direction at a position indicated by line G-G in FIG. 22.

FIG. 23 illustrates an example of the distribution of the hydrogen chemical concentration Dh, the distribution of the donor concentration Dd, and the distribution of the bulk donor concentration D0 in the depth direction at the position indicated by line G-G in FIG. 22. In the distribution of the hydrogen chemical concentration Dh and the distribution of the donor concentration Dd, the distribution inside the semiconductor substrate 10 is indicated by a solid line, and the virtual distribution outside the semiconductor substrate 10 is indicated by a broken line. The virtual distribution is a concentration distribution in a case where it is assumed that the semiconductor substrate 10 also exists in the region.

A local maximum of the first hydrogen concentration peak 201 of the hydrogen chemical concentration Dh is disposed below the lower surface 23 of the semiconductor substrate 10. That is, the first implantation position Zi1 is disposed below the depth position Z2. In FIG. 23, the distance between the first implantation position Zi1 and the depth position Z2 is smaller than the full width at half maximum FWHM of the first hydrogen concentration peak 201. In another example, the distance between the first implantation position Zi1 and the depth position Z2 may be 1 time or more, 5 times or more, or 10 times or more the full width at half maximum FWHM of the first hydrogen concentration peak 201. On both sides of the local maximum of the first hydrogen concentration peak 201, the distance between two points at which the hydrogen chemical concentration is 1% of the peak concentration Dhi1 is defined as FW1% M. The distance between the first implantation position Zi1 and the depth position Z2 may be 1 time or more, 5 times or more, or 10 times or more the FW1% M. By increasing the distance between the first implantation position Zi1 and the depth position Z2, the distribution of the hydrogen chemical concentration Dh and the donor concentration Dd in the semiconductor substrate 10 can be made uniform.

Also in the semiconductor apparatus 100 of the present example, at least one of the transistor and the diode may be formed as described in FIG. 12 to FIG. 21. The semiconductor apparatus 100 of the present example may also have each concentration distribution illustrated in FIG. 15 or 16.

Figure 24:
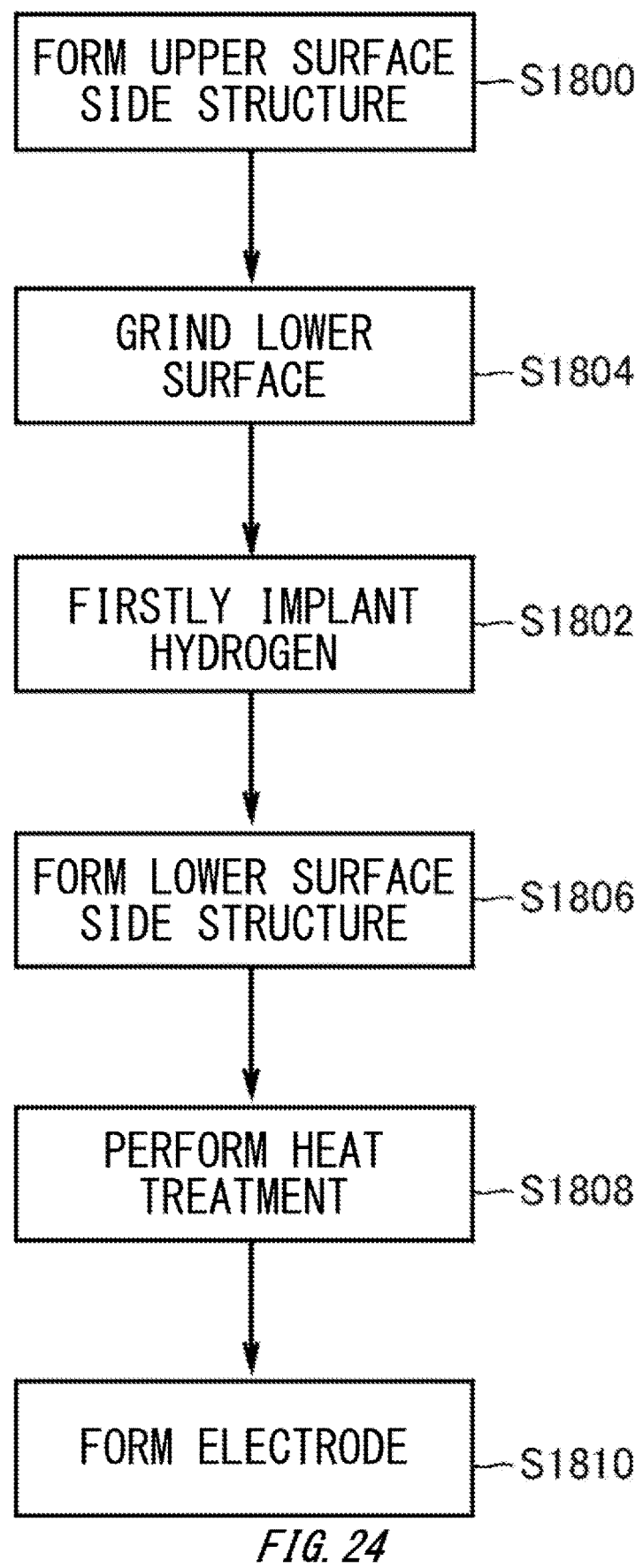
FIG. 24 is a diagram illustrating another example of the manufacturing method of the semiconductor apparatus 100.

FIG. 24 is a diagram illustrating another example of the manufacturing method of the semiconductor apparatus 100. The manufacturing method of the present example is different from the example of FIG. 18 in that the order of the grinding step S1804 and the first hydrogen implanting step S1802 is changed. The other steps are the same as the example of FIG. 18. In each of the examples described in FIG. 19 to FIG. 21, similarly to the present example, the grinding step S1804 may be performed before the first hydrogen implanting step S1802.

Figure 25:
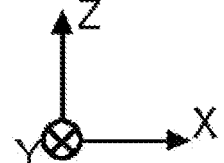
FIG. 25 is a sectional view illustrating an example of the semiconductor apparatus 100.

FIG. 25 is a sectional view illustrating an example of the semiconductor apparatus 100. The semiconductor apparatus 100 of the present example is different from the examples described in FIG. 1 to FIG. 24 in that the first implantation position Zi1 is located further outside (−Z axis side) the semiconductor substrate 10 than the position Z3 of the lower surface 19 before the semiconductor substrate 10 is ground. In other respects, the semiconductor apparatus 100 of the present example is the same as any of the semiconductor apparatuses 100 described in FIG. 1 to FIG. 24.

Figure 26:
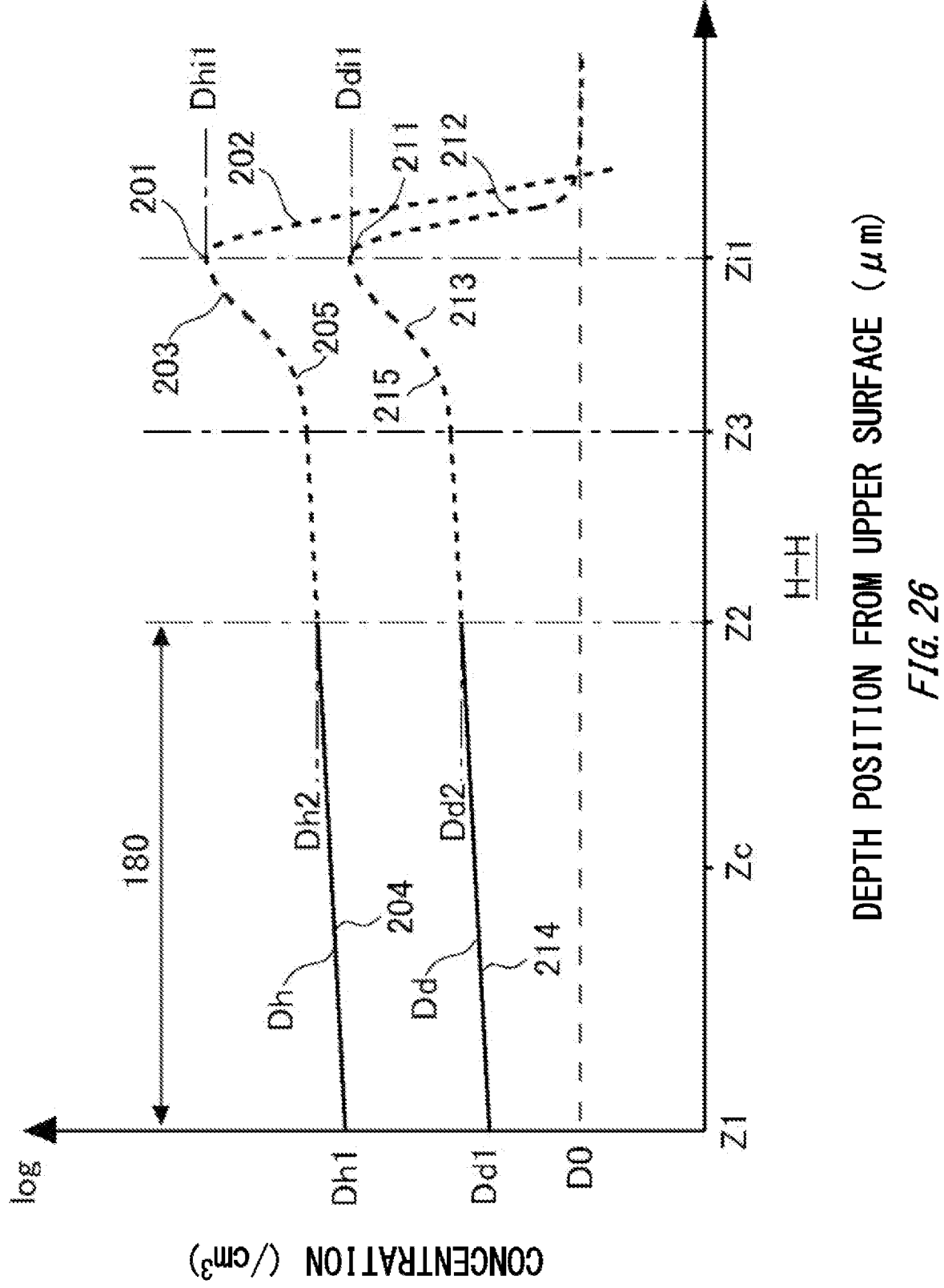
FIG. 26 is a diagram illustrating an example of a distribution of a hydrogen chemical concentration Dh, a distribution of a donor concentration Dd, and a distribution of a bulk donor concentration D0 in a depth direction at a position indicated by line H-H in FIG. 25.

FIG. 26 illustrates an example of the distribution of the hydrogen chemical concentration Dh, the distribution of the donor concentration Dd, and the distribution of the bulk donor concentration D0 in the depth direction at the position indicated by line H-H in FIG. 25. The difference from FIG. 2 is that the position Z3 of the lower surface 19 of the semiconductor substrate 10 before grinding is located closer to the upper surface 21 than the first hydrogen concentration peak 201. The position Z3 of the lower surface 19 may be located closer to the upper surface 21 than the upper tail 203. The position Z3 of the lower surface 19 may be located closer to the upper surface 21 than the connection portion 205.

Actually, first hydrogen concentration peak 201 is not formed in semiconductor substrate 10. However, the position Zi1 of the first hydrogen concentration peak 201 and the acceleration energy of hydrogen ion implantation may be set in advance by a known simulation technique, and the distribution of the hydrogen chemical concentration Dh, the distribution of the donor concentration Dd, and the like may be calculated.

The hydrogen chemical concentration Dh2 in the lower surface 23 may be 1.2 times or more, 1.5 times or more, or 2 times or more the hydrogen chemical concentration Dh1 in the upper surface 21. The hydrogen chemical concentration Dh2 in the lower surface 23 may be 10 times or less, 5 times or less, or 3 times or less the hydrogen chemical concentration Dh1 in the upper surface 21. The implantation of hydrogen ions may be performed before or after grinding the semiconductor substrate 10. In addition, the manufacturing method of the present example may be the same as that in any example of FIG. 18 to FIG. 21, and FIG. 24, and the order of each process may be appropriately changed.

Although the present invention has been described using the embodiments, the technical scope of the present invention is not limited to the scope described in the above embodiments. It is apparent to those skilled in the art that various modifications or improvements can be made to the above embodiments. It is apparent from the description of the claims that modes to which such changes or improvements are added can also be included in the technical scope of the present invention.

It should be noted that the order of execution of each processing such as operations, procedures, steps, and stages in the apparatuses, systems, programs, and methods illustrated in the claims, the specification, and the drawings can be realized in any order unless "before", "prior to", or the like is specifically stated, and unless the output of the previous processing is used in the later processing. Even if the operation flow in the claims, the specification, and the drawings is described using "First", "Next", and the like for convenience, it does not mean that it is essential to perform in this order.

33

34

What is claimed is:

1. A semiconductor apparatus comprising:
    a semiconductor substrate having an upper surface and a lower surface and containing a bulk donor;
    a hydrogen increasing portion in which a hydrogen chemical concentration of the hydrogen increasing portion monotonically increases from the upper surface toward the lower surface; and
    a hydrogen peak portion in which a hydrogen chemical concentration of the hydrogen peak portion includes one or more peaks,
    wherein the hydrogen peak portion is directly in contact with the lower surface side of the hydrogen increasing portion,
    wherein the hydrogen increasing portion is provided from the upper surface of the semiconductor substrate toward the lower surface of the semiconductor substrate including and over a center depth position of the semiconductor substrate in a depth direction,
    wherein a minimum hydrogen chemical concentration of the hydrogen chemical concentration of the hydrogen peak portion is not less than a hydrogen chemical concentration of the hydrogen increasing portion at the center depth position, and
    wherein a donor concentration in the hydrogen increasing portion is higher than a bulk donor concentration.

2. The semiconductor apparatus according to claim 1, wherein the hydrogen chemical concentration of the hydrogen increasing portion monotonically increases from the upper surface to the lower surface except for a portion where the hydrogen peak portion is provided.

3. The semiconductor apparatus according to claim 1, wherein the hydrogen increasing portion has, on a lower surface side of the semiconductor substrate, a portion where a gradient of a hydrogen chemical concentration distribution in a depth direction increases toward the lower surface.

4. The semiconductor apparatus according to claim 1, wherein the hydrogen peak portion is provided in a region other than the hydrogen increasing portion.

5. The semiconductor apparatus according to claim 4, comprising:
    a drift region of a first conductivity type provided in the semiconductor substrate;
    a base region of a second conductivity type provided between the upper surface of the semiconductor substrate and the drift region;
    an emitter region of a first conductivity type provided between the upper surface of the semiconductor substrate and the base region and having a higher doping concentration than the drift region;
    a buffer region of a first conductivity type provided between the lower surface of the semiconductor substrate and the drift region and having a higher doping concentration than the drift region; and
    a gate trench portion provided from the upper surface of the semiconductor substrate to a depth position reaching the drift region,
    wherein the buffer region includes the hydrogen peak portion, and the hydrogen increasing portion is disposed between a lower end of the gate trench portion and an upper end of the buffer region.

6. The semiconductor apparatus according to claim 5, wherein the hydrogen increasing portion is provided from the lower end of the gate trench portion to the upper end of the buffer region.

7. The semiconductor apparatus according to claim 6, wherein
    a distribution of a hydrogen chemical concentration in the buffer region has a lower tail from the hydrogen peak portion toward the lower surface and an upper tail from the hydrogen concentration peak toward the upper surface,
    a hydrogen chemical concentration of the upper tail changes more steeply than a hydrogen chemical concentration of the lower tail, and
    the hydrogen chemical concentration of the hydrogen increasing portion monotonically increases from the lower end of the gate trench portion to the upper tail.

8. The semiconductor apparatus according to claim 1, wherein the hydrogen increasing portion includes a lifetime adjustment portion that adjusts a lifetime of a carrier.

9. The semiconductor apparatus according to claim 4, comprising:
    a drift region of a first conductivity type provided in the semiconductor substrate;
    an accumulation region of a first conductivity type provided between the upper surface of the semiconductor substrate and the drift region and having a higher doping concentration than the drift region;
    a base region of a second conductivity type provided between the upper surface of the semiconductor substrate and the accumulation region;
    an emitter region of a first conductivity type provided between the upper surface of the semiconductor substrate and the base region and having a higher doping concentration than the drift region; and
    a gate trench portion provided from the upper surface of the semiconductor substrate to a depth position reaching the drift region,
    wherein the accumulation region includes the hydrogen concentration peak, and the hydrogen increasing portion is disposed between a lower end of the gate trench portion and the lower surface of the semiconductor substrate.

10. The semiconductor apparatus according to claim 1, wherein a hydrogen chemical concentration at an end portion on the lower surface side of the hydrogen increasing portion is higher than a hydrogen chemical concentration at an end portion on the upper surface side of the hydrogen increasing portion.

11. The semiconductor apparatus according to claim 4, wherein
    the hydrogen peak portion is disposed on the lower surface side of the semiconductor substrate with respect to the hydrogen increasing portion,
    the semiconductor apparatus further comprising:
    a valley portion of a hydrogen chemical concentration, which is disposed on the lower surface side of the semiconductor substrate with respect to the hydrogen concentration peak.

12. The semiconductor apparatus according to claim 1, wherein the hydrogen increasing portion has a variation of ±7% or less with respect to a straight line approximating a distribution shape of the hydrogen chemical concentration of the hydrogen increasing portion.

13. The semiconductor apparatus according to claim 1, wherein the hydrogen increasing portion is provided over 30% or more of the thickness of the semiconductor substrate in the depth direction.

14. The semiconductor apparatus according to claim 13, wherein the hydrogen increasing portion is provided over 50% or more of the thickness of the semiconductor substrate in the depth direction.

15. The semiconductor apparatus according to claim 14, wherein the hydrogen increasing portion is provided over 70% or more of the thickness of the semiconductor substrate in the depth direction.

\* \* \* \* \*